United States Patent
Nagatani et al.

(10) Patent No.: US 10,425,051 B2
(45) Date of Patent: Sep. 24, 2019

(54) ANALOG MULTIPLEXER CORE CIRCUIT AND ANALOG MULTIPLEXER CIRCUIT

(71) Applicant: NIPPON TELEGRAPH AND TELEPHONE CORPORATION, Tokyo (JP)

(72) Inventors: Munehiko Nagatani, Tokyo (JP); Hideyuki Nosaka, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 15/747,139

(22) PCT Filed: Jul. 21, 2016

(86) PCT No.: PCT/JP2016/071385
§ 371 (c)(1),
(2) Date: Jan. 23, 2018

(87) PCT Pub. No.: WO2017/014262
PCT Pub. Date: Jan. 26, 2017

(65) Prior Publication Data
US 2018/0219517 A1  Aug. 2, 2018

(30) Foreign Application Priority Data
Jul. 23, 2015  (JP) ................ 2015-145430

(51) Int. Cl.
*H03F 3/45* (2006.01)
*H03K 17/62* (2006.01)
(Continued)

(52) U.S. Cl.
CPC .............. *H03F 3/45* (2013.01); *H03K 17/62* (2013.01); *H03K 19/013* (2013.01); *H04B 1/04* (2013.01); *H04L 27/36* (2013.01)

(58) Field of Classification Search
CPC .......... H03F 3/45; H04B 1/04; H03K 19/013; H03K 17/62; H04L 27/36
(Continued)

(56) References Cited

FOREIGN PATENT DOCUMENTS

| JP | H08307228 | 11/1996 |
|---|---|---|
| JP | 2002-246861 A | 8/2002 |
| JP | 2010272921 | 12/2010 |
| WO | 2014/181869 A1 | 11/2014 |

OTHER PUBLICATIONS

Office Action received for Canadian Patent Application No. 2991865, dated Nov. 14, 2018, 6 pages.
Office Action received for Japanese Patent Application No. 2017-529923, dated Oct. 30, 2018, 6 pages (3 pages of English Translation and 3 pages of Office Action).
(Continued)

*Primary Examiner* — Khanh V Nguyen
*Assistant Examiner* — Khiem D Nguyen
(74) *Attorney, Agent, or Firm* — Womble Bond Dickinson (US) LLP

(57) ABSTRACT

An analog multiplexer core circuit (120A) includes a differential pair (121) that includes two transistors (Q1, Q2), a differential pair (122) that includes two transistors (Q3, Q4), a differential pair (123) that includes two transistors (Q5, Q6), and a constant current source (124) that causes a current ($I_{EE}$) to flow. This analog multiplexer core circuit (120A) time-multiplexes two analog signals (Ain1, Ain2) and outputs a time-multiplexed analog signal (Aout). Each emitter resistor ($R_{EA}1$, $R_{EA}2$, $R_{EA}3$, $R_{EA}4$) is connected to a corresponding one of the transistors (Q1, Q2, Q3, Q4). At this time, a relation of "$R_{EA} \cdot I_{EE} \geq$ the amplitude of an input analog signal" is satisfied. As a result, linearity of response can be ensured by expanding the linear response input range of the differential pairs (121, 122).

19 Claims, 24 Drawing Sheets

(51) Int. Cl.
*H04L 27/36* (2006.01)
*H03K 19/013* (2006.01)
*H04B 1/04* (2006.01)

(58) Field of Classification Search
USPC .......................................... 330/51, 252–261
See application file for complete search history.

(56) References Cited

OTHER PUBLICATIONS

International Search Report and Written Opinion received for PCT Patent Application No. PCT/JP2016/071385, dated Oct. 4, 2016, 14 pages (7 pages of English Translation and 7 pages of Original Document).

International Preliminary Report on Patentability received for PCT Patent Application No. PCT/JP2016/071385, dated Feb. 1, 2018, 14 pages (8 pages of English Translation and 6 pages of Original Document).

Ishii, K., et al., "Very-high-speed selector IC using InP/InGaAs heterojunction bipolar transistors," Electronic Letters, May 9, 2002, vol. 38, No. 10, pp. 480-481.

Sugihara, T., et al., "Electronic Pre-equalization Technologies using High-Speed DAC," Optical Society of America, ECOC Technical Digest, 3 pages (2011).

Supplementary European Search Report and Written Opinion received for EP Patent Application No. 16827822.4, dated Feb. 12, 2019, 11 pages.

ANALOG MULTIPLEXER CORE CIRCUIT AND ANALOG MULTIPLEXER CIRCUIT

TECHNICAL FIELD

The present invention relates to an analog multiplexer core circuit and an analog multiplexer circuit that have a function of time-multiplexing two or more analog signals with high linearity and high speed.

BACKGROUND ART

In recent years, in order to further increase the speed and the capacity of an optical communication system, the adoption of a multilevel modulation method (Quadrature Amplitude Modulation (QAM)) or the like is being considered. A transmission device of such an optical communication system requires a high-speed digital-to-analog converter (to be referred to as a DAC hereinafter) to generate a multilevel modulation signal. To implement a high-speed DAC, a time-interleaved device as that shown in FIG. 19 is effective (for example, see Non-Patent Literature 1). The time-interleaved digital-to-analog conversion device shown in FIG. 19 will be described here.

A first digital-to-analog converter DAC1 performs analog/digital conversion and outputs a first analog signal A1 when an N-bit first digital signal D1 is input to an input terminal and a clock signal CLK (0°) that has been phase-shifted by 0° by a phase shifter S1 is input to a sync input terminal. A second digital-to-analog converter DAC2 performs analog/digital conversion and outputs a second analog signal A2 when an N-bit second digital signal D2 is input to an input terminal and the clock signal CLK (180°), which has been phase-shifted by 180° by a phase shifter S2, is input to a sync input terminal. Upon input of the first and second analog signals A1 and A2 and the clock signal CLK (90°) that has been phase-shifted by 90° by a phase shifter S3, an analog multiplexer core circuit M performs a time-multiplexing process and outputs a time-multiplexed analog signal Aout.

Note that FIG. 20 is a timing chart showing the signal waveforms of the digital-to-analog conversion device of FIG. 19. (a) indicates the analog signal A1, (b) indicates the analog signal A2, (c) indicates the time-multiplexed analog signal Aout, (d) indicates the clock signal CLK (0°) to be input to the digital-to-analog converter DAC1, (e) indicates the clock signal CLK (180°) to be input to the digital-to-analog converter DAC2, and (f) indicates the clock signal CLK (90°) to be input to the analog multiplexer core circuit M.

In the time-interleaved digital-to-analog conversion device shown in FIG. 19, the performance of the analog multiplexer core circuit M, which serves as a component, has a large influence on the characteristics of the entire device.

The analog multiplexer can be regarded as an analog switch functionally, as shown in FIG. 21. That is, when the switching cycle is set as $1/f_{SW}$ by setting the switching frequency as $f_{SW}$, the analog multiplexer has a function of outputting the time-multiplexed analog signal Aout by switching between an analog signal Ain1 and an analog signal Ain2 as input signals and selectively outputting one of the signals.

An example of a general analog-multiplexer core circuit with the simplest arrangement is shown in FIG. 22. In this circuit, analog signals can be selectively switched and output by FET gating. That is, in this analog multiplexer core circuit, the drain of FET gating F1 is connected to the drain of FET gating F2, and the connecting portion serves as an output terminal. In the FET gating F1, the analog signal Ain1 is input to the source and a positive-phase signal CLK+ is input to the gate. In the FET gating F2, the analog signal Ain2 is input to the source and a negative-phase signal CLK− (which is phase-shifted by 180° with respect to the positive phase) is input to the gate. This sets the FET gating F1 and FET gating F2 to be alternately in a conductive state and causes the time-multiplexed analog signal Aout to be output.

The analog multiplexer core circuit shown in FIG. 22 has good linearity but has problems with high-speed operation. This is because the switching speed between the FET gating F1 and the FET gating F2 cannot reach the required high speed.

On the other hand, in the case of a multiplexer (core) circuit that handles digital signals as shown in FIG. 23, there have been many reports of circuits that operate at a speed of 50 Gb/s or more (for example, see Non-Patent Literature 2). The multiplexer core circuit shown in FIG. 23 is formed using emitter-coupled logic (ELC) and is capable of extremely high-speed operation by causing a transistor to operate in a non-saturation region. A detailed description of this circuit will be given hereinafter. Note that in the following description, a negative-phase signal of a given signal, with respect to a positive-phase signal of the given signal, indicates a signal which has the same amplitude but has a phase which has been inverted by 180°.

A differential pair 11 arranged on an upper stage of the circuit diagram is formed by emitter-coupled logic in which the emitter of a transistor Q1 is connected to the emitter of a transistor Q2. Each of the collectors of the transistors Q1 and Q2 is connected to a high-potential power supply VCC via a corresponding one of collector resistors Rc1 and Rc2. A positive-phase signal Din1+ of a first digital signal is input to the base of the transistor Q1. A negative-phase signal Din1− of the first digital signal is input to the base of the transistor Q2.

A differential pair 12 arranged on an upper stage of the circuit diagram is formed by emitter-coupled logic in which the emitter of a transistor Q3 is connected to the emitter of a transistor Q4. Each of the collectors of the transistors Q3 and Q4 is connected to the high-potential power supply VCC via a corresponding one of the collector resistors Rc1 and Rc2. A positive-phase signal Din2+ of a second digital signal is input to the base of the transistor Q3. A negative-phase signal Din2− of the second digital signal is input to the base of the transistor Q4.

An output terminal OUT+ is connected to the collectors of the respective transistors Q2 and Q4. An output terminal OUT− is connected to the collectors of the respective transistors Q1 and Q3.

A differential pair 13 arranged on the lower stage in the circuit diagram is formed by emitter-coupled logic in which the emitter of a transistor (fifth transistor) Q5 is connected to the emitter of a transistor (sixth transistor) Q6. The collector of the transistor Q5 is connected to the emitters of the respective transistors Q1 and Q2. The collector of the transistor Q6 is connected to the emitters of the respective transistors Q3 and Q4. A positive-phase signal CLK+ of a clock signal CLK is input to the base of the transistor Q5. A negative-phase signal CLK− of the clock signal CLK is input to the base of the transistor Q6.

One terminal of a constant current source 14 is connected to the emitters of the respective transistors Q5 and Q6. The other terminal of the constant current source 14 is connected to a low-voltage power supply VEE. The constant current source 14 causes a constant current $I_{EE}$ of a predetermined constant value to flow.

In the multiplexer core circuit shown in FIG. 23, the transistor Q5 is set to a conductive state and the transistor Q6 is set to a cut-off state when the positive-phase signal CLK+ of the clock signal CLK is at high level (H) and the negative-phase signal CLK− is at low level (L). Hence, the first digital signals Din1+ and Din1− are amplified by the first differential pair 11 (transistors Q1 and Q2) and output from the output terminals OUT+ and OUT−. On the other hand, when the positive-phase signal CLK+ of the clock signal is at L and the negative-phase signal CLK− of the clock signal is at H, the transistor Q6 is set to the conductive state and the transistor Q5 is set to the cut-off state. Hence, the second digital signals Din2+ and Din2− are amplified by the second differential pair 12 (transistors Q3 and Q4) and output from the output terminals OUT+ and OUT−.

In this manner, in accordance with the signal levels of the clock signals CLK+ and CLK− alternately changing between H and L, the first digital signals Din1+ and Din1− and the second digital signals Din2+ and Din2− are alternately output as time-multiplexed digital signals Dout+ and Dout− from the output terminals OUT+ and OUT−.

However, in the circuit arrangement shown in FIG. 23, it is difficult to handle an analog signal since waveform distortion is generated because linearity of response to an input signal cannot be ensured. This is because when the amplitude of the input signal is too large, the amplification of the differential pairs 11 and 12 is restricted and the amplitude of the output signal is restricted. As a result, the output signal is distorted when an analog signal is handled.

RELATED ART LITERATURE

Non-Patent Literature

Non-Patent Literature 1: "Electronic Pre-equalization Technologies using High-Speed DAC", ECOC2011, Tu.6.B.2
Non-Patent Literature 2: "Very-high-speed selector IC using InP/InGaAs heterojunction bipolar transistors", Electronics Letters, Vol. 38, No. 10, May 2002. p 480-481

DISCLOSURE OF INVENTION

Problem to be Solved by the Invention

Therefore, the present invention has as its object to provide an analog multiplexer core circuit and an analog multiplexer circuit that are capable of time-multiplexing two or more analog signals with high linearity and high speed.

Means of Solution to the Problem

In order to achieve the above-described object, the analog multiplexer core circuit of the present invention includes a first differential pair that includes a first transistor and a second transistor, the first transistor including a collector which is connected to a high-potential power supply via a first collector resistor, a base to which a positive-phase signal of a first analog signal is input, and an emitter, and the second transistor including a collector which is connected to the high-potential power supply via second collector resistor, a base to which a negative-phase signal of the first analog signal is input, and an emitter, a second differential pair that includes a third transistor and a fourth transistor, the third transistor including a collector which is connected to the high-potential power supply via the first collector resistor, a base to which a positive-phase signal of a second analog signal is input, and an emitter, and the fourth transistor including a collector connected to the high-potential power supply via the second collector resistor, a base to which a negative-phase signal of the second analog signal is input, and an emitter, a first output terminal that is connected to the collector of the second transistor and the collector of the fourth transistor, a second output terminal that is connected to the collector of the first transistor and the collector of the third transistor, a third differential pair that includes a fifth transistor and a sixth transistor, the fifth transistor including a collector, a base to which a positive-phase signal of a clock signal is input, and an emitter, and the sixth transistor including a collector, a base to which a negative-phase signal of the clock signal is input, and an emitter, a first current source configured to cause a current of a current value $I_{EE}$ to flow and includes one terminal which is connected to the emitter of the fifth transistor and the emitter of the sixth transistor and the other terminal which is connected to a low-potential power supply, a first emitter resistor that is connected between the emitter of the first transistor and the collector of the fifth transistor, a second emitter resistor that is connected between the emitter of the second transistor and the collector of the fifth transistor, a third emitter resistor that is connected between the emitter of the third transistor and the collector of the sixth transistor, and a fourth emitter resistor that is connected between the emitter of the fourth transistor and the collector of the sixth transistor, wherein a resistance value $R_{EA}$ of each of the first emitter resistor to the fourth emitter resistor satisfies $$R_{EA} \cdot I_{EE} \geq \text{an amplitude of each of the first analog signal and the second analog signal} \qquad (1)$$

The analog multiplexer circuit of the present invention also includes the above-described analog multiplexer core circuit and a differential amplifier that is connected to the first output terminal and the second output terminal of the analog multiplexer core circuit and configured to differentially amplify a positive-phase signal of a time-multiplexed analog signal output from the first output terminal and a negative-phase signal of the time-multiplexed analog signal output from the second terminal.

Effect of the Invention

According to the present invention, it is possible to time-multiplex two or more analog signals with high linearity and high speed.

BEST MODE FOR CARRYING OUT THE INVENTION

The embodiments of an analog multiplexer circuit according to the present invention will be described in detail below with reference to the accompanying drawings.

First Embodiment

Figure 1:
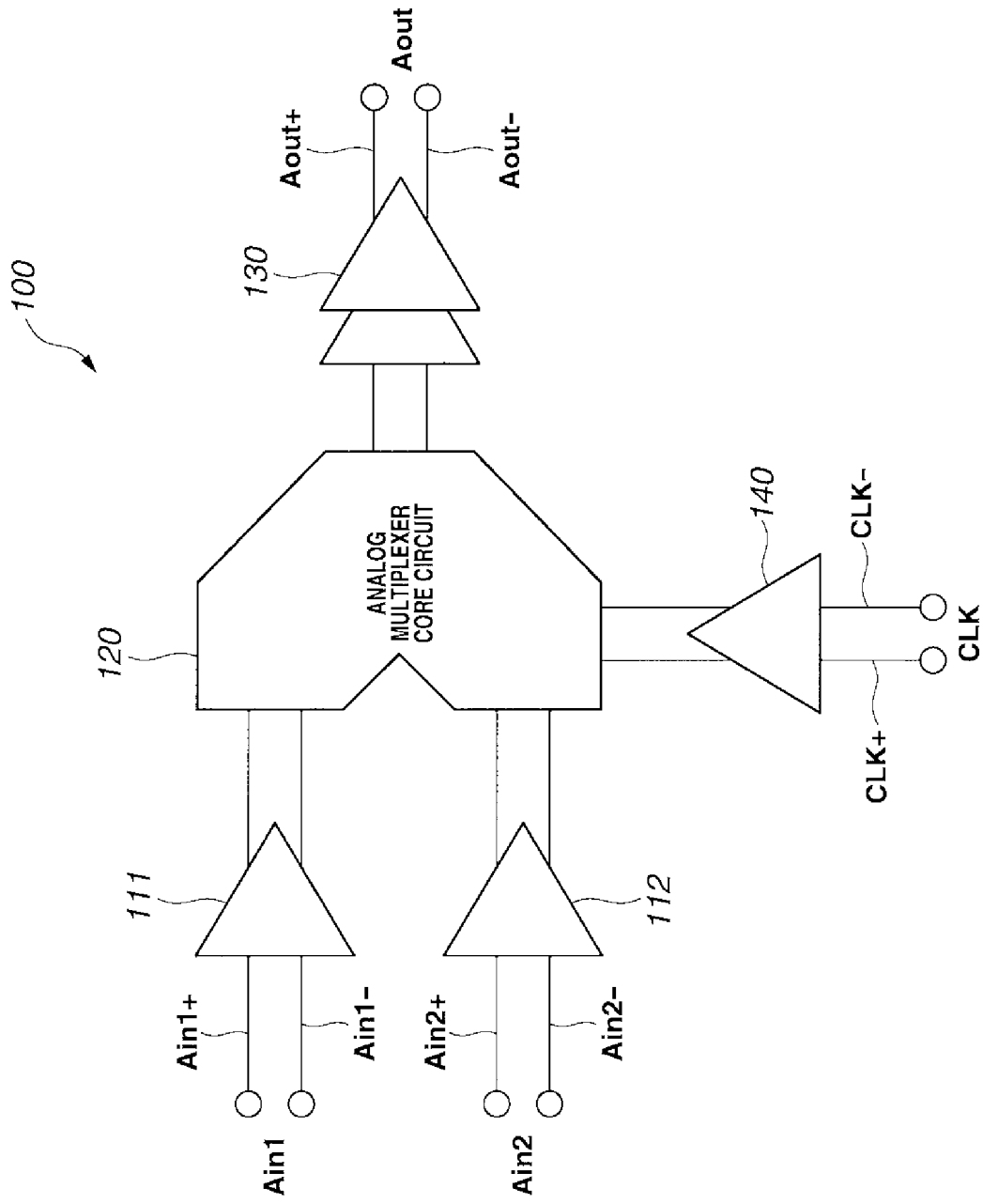
FIG. 1 is a block diagram showing an analog multiplexer circuit according to the first embodiment of the present invention.

FIG. 1 shows a block diagram (basic system) of an analog multiplexer circuit 100 according to the first embodiment of the present invention. The analog multiplexer circuit 100 has a fully differential structure. A fully differential structure refers to a structure formed from symmetrical circuits that use all signals as differential signals. Analog signals Ain1 (Ain1+, Ain1−) and Ain2 (Ain2+, Ain2−) are input to an analog multiplexer core circuit 120 via linear buffers 111 and 112. In the analog multiplexer core circuit 120, a time-multiplexing process is performed in accordance with a clock signal CLK (CLK+, CLK−), and a time-multiplexed analog signal Aout (Aout+, Aout−) is output via one or a plurality of differential amplifiers 130. Note that the clock signal CLK is input to the analog multiplexer core circuit 120 via a buffer 140.

Particularly, in the first embodiment, an important point is that a circuit provided with an arrangement described hereinafter is to be adopted as the analog multiplexer core circuit 120 and one or a plurality of differential amplifiers 130 are arranged immediately subsequent to the analog multiplexer core circuit.

<First Detailed Arrangement Example of Analog Multiplexer Core Circuit 120>

Figure 2:
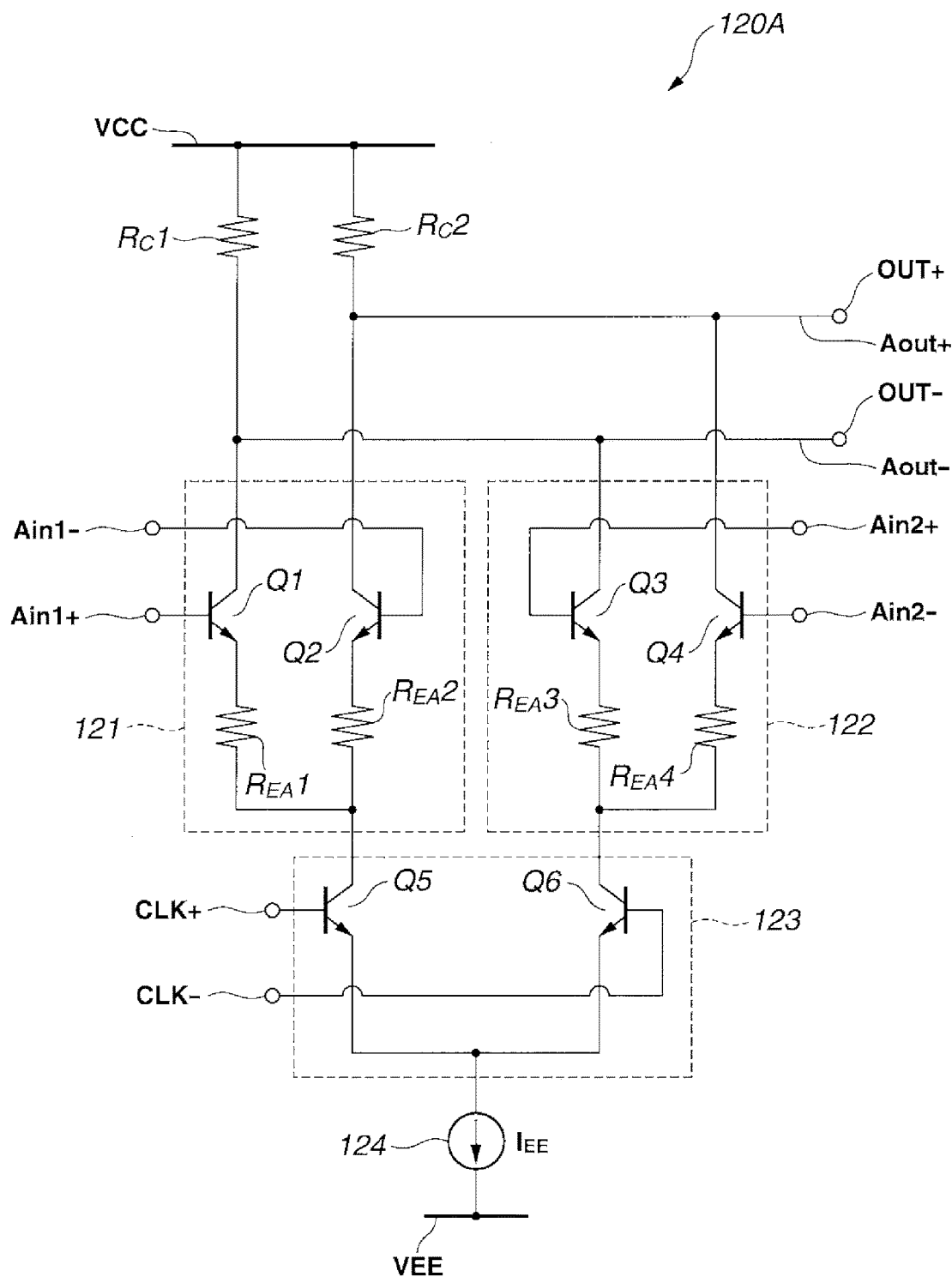
FIG. 2 is a circuit diagram showing a first detailed arrangement example of an analog multiplexer core circuit.

FIG. 2 shows an analog multiplexer core circuit 120A which is the first detailed arrangement example that can be used as the analog multiplexer core circuit 120 shown in FIG. 1.

A first differential pair 121 arranged on the upper stage of the circuit diagram is formed by emitter-coupled logic in which the emitter of a transistor (first transistor) Q1 is connected to the emitter of a transistor (second transistor) Q2. The collector of the transistor Q1 is connected to a high-potential power supply VCC via a collector resistor (first collector resistor) Rc1. The collector of the transistor Q2 is connected to the high-potential power supply VCC via a collector resistor (second collector resistor) Rc2. The positive-phase signal Ain1+ of the first analog signal Ain1 is input to the base of the transistor Q1. The negative-phase signal Ain1− of the first analog signal Ain1 is input to the base of the transistor Q2.

A second differential pair 122 arranged on the upper stage of the circuit diagram is formed by emitter-coupled logic in which the emitter of a transistor (third transistor) Q3 is connected to the emitter of a transistor (fourth transistor) Q4. The collector of the transistor Q3 is connected to the high-potential power supply VCC via the collector resistor Rc1. The collector of the transistor Q4 is connected to the high-potential power supply VCC via the collector resistor Rc2. The positive-phase signal Ain2+ of the second analog signal Ain2 is input to the base of the transistor Q3. The negative-phase signal Ain2− of the second analog signal Ain2 is input to the base of the transistor Q4.

An output terminal (first output terminal) OUT+ is connected to the collectors of the respective transistors Q2 and Q4. An output terminal (second output terminal) OUT− is connected to the collectors of the respective transistors Q1 and Q3.

A third differential pair 123 arranged on the lower stage in the circuit diagram is formed by emitter-coupled logic in which the emitter of a transistor (fifth transistor) Q5 is connected to the emitter of a transistor (sixth transistor) Q6. The collector of the transistor Q5 is connected to the emitters of the respective transistors Q1 and Q2. The collector of the transistor Q6 is connected to the emitters of the respective transistors Q3 and Q4. The positive-phase signal CLK+ of the clock signal CLK is input to the base of the transistor Q5. The negative-phase signal CLK− of the clock signal CLK is input to the base of the transistor Q6.

One terminal of a constant current source (first current source) 124 is connected to the emitters of the respective transistors Q5 and Q6. The other terminal of the constant current source 124 is connected to a low-voltage power supply VEE. The constant current source 124 causes a constant current $I_{EE}$ of a predetermined constant value to flow.

Furthermore, in this embodiment, an emitter resistor (first emitter resistor) $R_{EA}1$ is connected to the emitter of the transistor Q1. In the same manner, an emitter resistor (second emitter resistor) $R_{EA}2$ is connected to the emitter of the transistor Q2, an emitter resistor (third emitter resistor) $R_{EA}3$ is connected to the emitter of the transistor Q3, and an emitter resistor (fourth emitter resistor) $R_{EA}4$ is connected to the emitter of the transistor Q4. That is, the emitter resistor $R_{EA}1$ is connected between the emitter of the transistor Q1 and the collector of the transistor Q5, the emitter resistor $R_{EA}2$ is connected between the emitter of the transistor Q2 and the collector of the transistor Q5, the emitter resistor $R_{EA}3$ is connected between the emitter of the transistor Q3 and the collector of the transistor Q6, and the emitter resistor $R_{EA}4$ is connected between the emitter of the transistor Q4 and the collector of the transistor Q6. Note that the emitter resistors $R_{EA}1$ to $R_{EA}4$ will be representatively indicated as emitter resistors $R_{EA}$.

The characteristic of this analog multiplexer core circuit 120A is that the emitter resistors $R_{EA}$ satisfying equation (1) below have been inserted in the upper-stage differential pairs 121 and 122 to ensure a linear response to the analog signals Ain1 (Ain1+, Ain1−) and Ain2 (Ain2+, Ain2−) which are the input signals. Note that the amplitude of an analog signal indicates the voltage amplitude, is the peak value of each of the voltage amplitudes of the analog signals Ain1+ and Ain1− in the case of the analog signal Ain1, and is the peak value of each of the voltage amplitudes of the analog signals Ain2+ and Ain2− in the case of the analog signal Ain2.

$$R_{EA} \cdot I_{EE} \geq \text{the amplitude of an input analog signal} \qquad (1)$$

Equation (1) represents that the product of the resistance value $R_{EA}$, of each of the emitter resistors $R_{EA}1$ to $R_{EA}4$ and the current value $I_{EE}$ flowing in the constant current source 124 is equal to or more than the amplitude of each of the analog signals Ain1 and Ain2.

In the analog multiplexer core circuit 120A shown in FIG. 2, transistor Q5 is set to a conductive state and the transistor Q6 is set to a cut-off state when the positive-phase signal CLK+ of the clock signal CLK is at high level (H) and the negative-phase signal CLK− of the clock signal is at low level (L). Hence, the first analog signals Ain1+ and Ain1− are amplified by the first differential pair 121 (transistors Q1 and Q2) and output from the output terminals OUT+ and OUT−. On the other hand, when the positive-phase signal CLK+ is at L and the negative-phase signal CLK− is at H, the transistor Q6 is set to the conductive state and the transistor Q5 is set to the cut-off state. Hence, the second analog signals Ain2+ and Ain2− are amplified by the second differential pair 122 (transistors Q3 and Q4) and output from the output terminals OUT+ and OUT−.

In this manner, in accordance with the signal levels of the clock signals CLK+ and CLK− alternately changing between H and L, the first analog signals Ain1+ and Ain1− and the second analog signals Ain2+ and Ain2− are alternately output as the time-multiplexed analog signals Aout+ and Aout− from the output terminals OUT+ and OUT−.

At this time, since the analog multiplexer core circuit 120A satisfies the above-described equation (1), the linearity of response to the analog signals Ain1 and Ain2 as the input signals can be ensured. The reason why such linearity of response can be ensured in this manner will be explained below. In general, a linear response can be obtained in a transistor only when a collector current increases linearly in accordance with the increase in the base current. When the emitter resistors $R_{EA}$ are connected to the emitters of the transistors Q1 to Q4 according to this embodiment, the emitter resistors $R_{EA}$ function as negative feedback resistors so that an increase in the base current is suppressed. Hence, even if the analog signals Ain1 and Ain2 with comparatively large amplitudes are input, a linear response is obtained by the suppression of the base current. As a result, it expands the linear response input range of the differential pairs 121 and 122. However, if the analog signals Ain1 and Ain2 whose amplitudes are too large to satisfy equation (1) are input, it becomes impossible to obtain a linear response since it will be difficult to increase the collector current.

Figure 3:
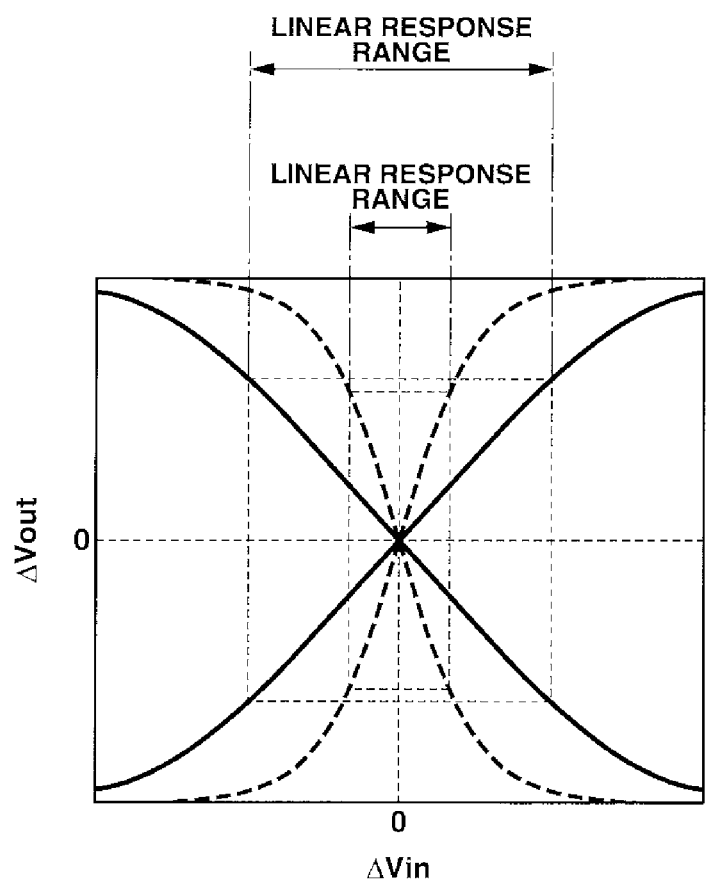
FIG. 3 is a graph showing the input/output characteristics of a differential pair of the analog multiplexer core circuit.

FIG. 3 shows the input/output characteristics of the differential pairs 121 and 122. The abscissa represents an amplitude ΔVin of an input analog signal, and the ordinate represents an amplitude ΔVout of an amplified and output analog signal. Also, a solid line represents the characteristics when the emitter resistors $R_{EA}$ have been inserted, and a dotted line represents the characteristics when the emitter resistors $R_{EA}$ have not been inserted. It is also apparent from the characteristics of FIG. 3 that the linear response input range of the differential amplifiers 121 and 122 has expanded.

<Second Detailed Arrangement Example of Analog Multiplexer Core Circuit 120>

Figure 4:
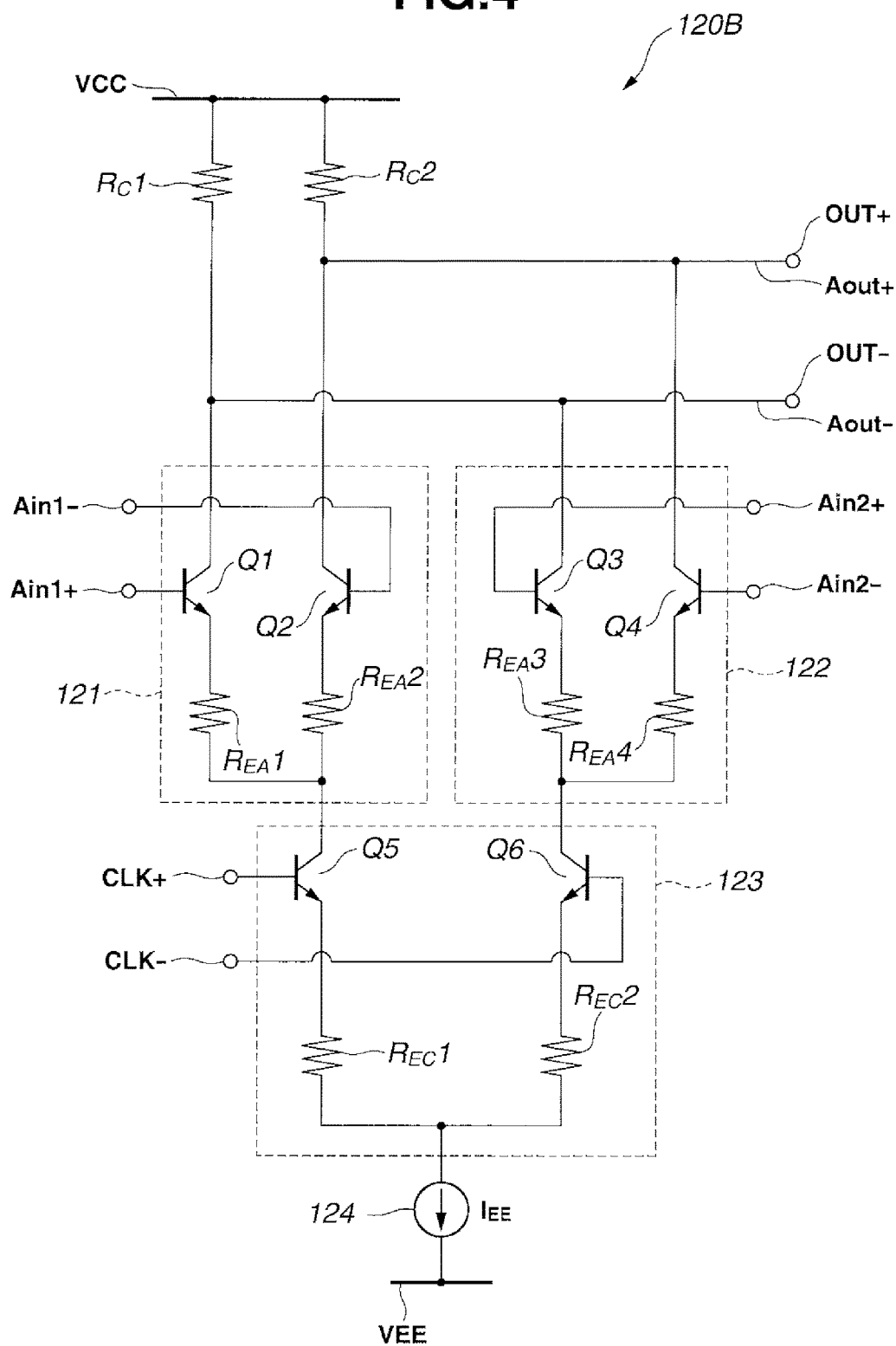
FIG. 4 is a circuit diagram showing a second detailed arrangement example of the analog multiplexer core circuit.

FIG. 4 shows an analog multiplexer core circuit 120B as the second detailed arrangement example that can be used as the analog multiplexer core circuit 120 shown in FIG. 1.

In the analog multiplexer core circuit 120B, an emitter resistor (fifth emitter resistor) $R_{EC}1$ is connected to the emitter of the transistor Q5 and an emitter resistor (sixth emitter resistor) $R_{EC}2$ is connected to the emitter of the transistor Q6. That is, the emitter resistor $R_{EC}1$ is connected between the emitter of the transistor Q5 and one terminal of the constant current source 124, and the emitter resistor $R_{EC}2$ is connected between the emitter of the transistor Q6 and the one terminal of the constant current source 124. Note that emitter resistors $R_{EC}1$ and $R_{EC}2$ will be representatively indicated as emitter resistors $R_{EC}$. Other parts are the same as those shown in the analog multiplexer core circuit 120A including the emitter resistors $R_{EA}$ in FIG. 2.

The analog multiplexer core circuit 120B is characterized in that the emitter resistors $R_{EA}$, which satisfy equation (1) below, are inserted to the upper-stage differential pairs 121 and 122, and the emitter resistors $R_{EC}$, which satisfy equation (2) below, are inserted in the lower-stage differential pair 123 to ensure a linear response to the analog signals Ain1 (Ain1+, Ain−) and Ain2 (Ain2+, Ain2−) as the input signals.

$$R_{EA} \cdot I_{EE} \geq \text{the amplitude of an input analog signal} \qquad (1)$$

$$R_{EC} \cdot I_{EE} < \text{the amplitude of the input clock signal} \qquad (2)$$

Equation (2) represents that the product of the resistance value $R_{EC}$ of each of the emitter resistors $R_{EC}1$ to $R_{EC}2$ and the current value $I_{EE}$ flowing in the constant current source 124 is less than the amplitude of the clock signal CLK.

At this time, since the analog multiplexer core circuit 120B satisfies the above-described equations (1) and (2), it can ensure the linearity of response to the analog signals Ain1 (Ain1+, Ain−) and Ain2 (Ain2+, Ain2−) as the input signals. The reason why such linearity of response can be ensured in this manner will be explained below.

Since equation (1) is satisfied by the upper-stage differential pairs 121 and 122 in the aforementioned manner, the linear response input range can be expanded to ensure linearity of response.

In the lower-stage differential pair 123, the characteristics of equation (2) having characteristics (characteristics that does not expand the linear response range) opposite to the characteristics (characteristics that expand the linear response range) of equation (1) can be obtained. Hence, a switching operation between the transistor Q5 and the transistor Q6, in which one transistor is turned on while the other is turned off, can be ensured. That is, this indicates that, although each emitter resistor $R_{EC}$ which serves as a negative feedback resistor to improve operational stability can be inserted in the lower-stage differential pair 123, a resistance value as the upper limit satisfying equation (2) should be set to ensure the switching operation.

<First Detailed Arrangement Example of Linear Differential Amplifier 130>

Figure 5:
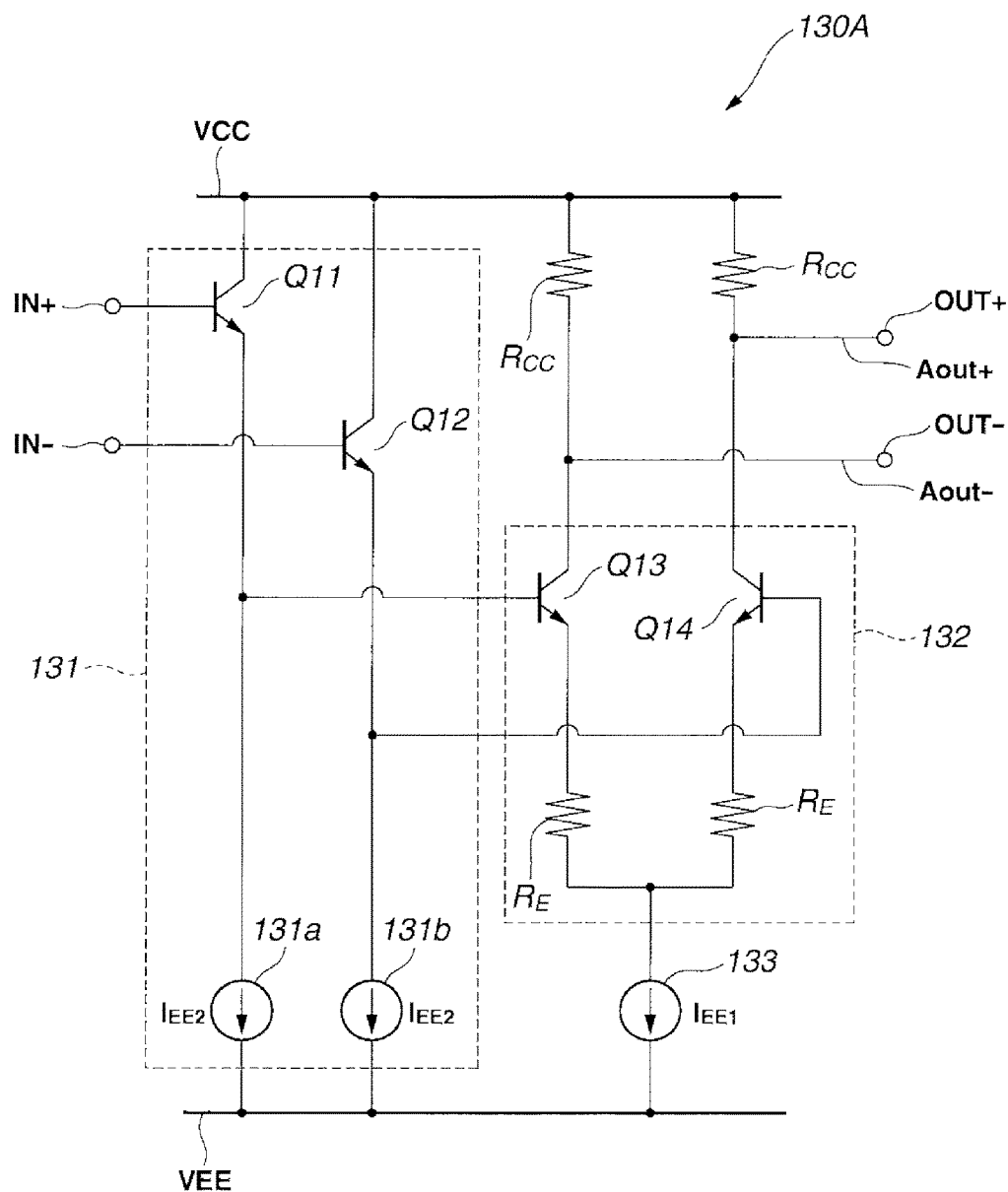
FIG. 5 is a circuit diagram showing a first detailed arrangement example of a linear differential amplifier.

FIG. 5 shows a linear differential amplifier 130A as the first detailed arrangement example that can be used as the linear differential amplifier 130 shown in FIG. 1.

Linearity of response to the analog input signals can be ensured by using the analog multiplexer core circuit 120A shown in FIG. 2 or the analog multiplexer core circuit 120B shown in FIG. 4. However, this cannot prevent the leakage of switching noise of the clock signal CLK to the output terminals. Hence, in the analog multiplexer circuit 100 shown in FIG. 1, one or a plurality of the linear differential amplifiers 130A shown in FIG. 5 are provided immediately subsequent to the analog multiplexer core circuit 120A or 120B of FIG. 2 or FIG. 4.

Each linear differential amplifier 130A is connected to the output terminals OUT+ and OUT− of the analog multiplexer core circuit 120A (or 120B) and differentially amplifies the positive-phased signal Aout+ of the time-multiplexed analog signal output from the output terminal OUT+ and the negative-phased signal Aout− output of the time-multiplexed analog signal output from the output terminal OUT−. The linear differential amplifier 130A includes a preceding-stage emitter-follower circuit unit (level shifter) 131 which shifts the direct current (DC) voltage level of the time-multiplexed analog signals Aout+ and Aout− and a subsequent-stage differential amplifier circuit unit which includes a differential pair (fourth differential pair) 132 as the main member.

The emitter-follower circuit unit 131 includes two systems of emitter-follower circuits. The emitter-follower circuit of the first system includes a transistor (eleventh transistor) Q11 whose collector is connected to the high-potential power supply VCC and whose base is connected to an input terminal IN+, and a constant current source (first constant current source) 131a whose one terminal is connected to the emitter of the transistor Q11 and whose other terminal is connected to the low-potential power supply VEE. The output terminal OUT+ of the analog multiplexer core circuit 120A (or 120B) is connected to the input terminal IN+, and the time-multiplexed analog signal Aout+ is input from the output terminal OUT+. The constant current source 131a causes a constant current $I_{EE2}$ of a predetermined constant value to flow.

The emitter-follower circuit of the second system includes a transistor (twelfth transistor) Q12 whose collector is connected to the high-potential power supply VCC and whose base is connected to an input terminal IN−, and a constant current source (second current source) 131b whose one terminal is connected to the emitter of the transistor Q12 and whose other terminal is connected to the low-potential power supply VEE. The output terminal OUT− of the analog multiplexer core circuit 120A (or 120B) is connected to the input terminal IN−, and the time-multiplexed analog signal Aout− is input from the output terminal OUT−. The constant current source 131b causes a constant current $I_{EE2}$ of a predetermined constant value to flow.

The differential pair 132 of the differential amplifier circuit unit is formed by emitter-coupled logic in which the emitter of a transistor (seventh transistor) Q13 is connected to the emitter of a transistor (eighth transistor) Q14. The collector of the transistor Q13 is connected to the high-potential power supply VCC via a collector resistor (third collector resistor) Rcc. The base of the transistor Q13 is connected to the emitter of the transistor Q11 forming the emitter-follower circuit of the first system. That is, the time-multiplexed analog signal Aout+ is input to the base of the transistor Q13 via the transistor Q11. The collector of the transistor Q14 is connected to the high-potential power supply VCC via a collector resistor (fourth collector resistor) Rcc. The base of the transistor Q14 is connected to the emitter of the transistor Q12 that forms the emitter-follower circuit of the second system. That is, the time-multiplexed analog signal Aout− is input to the base of the transistor Q14 via the transistor Q12.

An output terminal (third output terminal) OUT+ is connected to the collector of the transistor Q14. An output terminal (fourth output terminal) OUT− is connected to the collector of the transistor Q13. One terminal of a constant current source (second current source) 133 is connected to the emitters of the respective transistors Q13 and Q14. The other terminal of the constant current source 133 is connected to the low-potential power supply VEE. The constant current source 133 causes a constant current $I_{EE1}$ of a predetermined constant value to flow.

An emitter resistor (seventh emitter resistor) $R_E$ is connected to the emitter of the transistor Q13, and an emitter resistor (eighth emitter resistor) $R_E$ is connected to the emitter of the transistor Q14. That is the emitter resistor $R_E$ is connected between the emitter of the transistor Q13 and one terminal of the constant current source 133, and the emitter resistor $R_E$ is connected between the emitter of the transistor Q14 and one terminal of the constant current source 133.

To ensure linearity of response, the differential amplifier circuit unit is also characterized in that it includes the emitter resistors $R_E$ which satisfy equation (3) below.

$$R_E \cdot I_{EE1} \geq \text{the amplitude of an input analog signal} \quad (3)$$

Equation (3) represents that the product of the resistance value $R_E$ of each of the emitter resistors $R_E$ and the current value $I_{EE1}$ flowing in the constant current source 133 is equal to or more than the amplitude of each of the time-multiplexed analog signals Aout+ and Aout−. The technical meaning of equation (3) is the same as that of equation (1), and equation (3) ensures the linearity of response by expanding the linear response input range.

In the linear differential amplifier 130A, the time-multiplexed analog signals Aout+ and Aout− output from the analog multiplexer core circuit 120A (or 120B) are input to the input terminal IN+ and IN−, respectively, and the DC levels are adjusted by the emitter-follower circuit unit 131. The time-multiplexed analog signals Aout+ and Aout− with adjusted DC levels are differentially amplified by the differential pair 132 (transistors Q13 and Q14). The amplified time-multiplexed analog signals Aout+ and Aout− are output from the output terminals OUT+ and OUT−.

When switching noise is generated by the clock signal CLK, the noise is superimposed as inphase signal noise on the time-multiplexed analog signals Aout+ and Aout−. Hence, by differentially amplifying the time-multiplexed analog signals Aout+ and Aout− by the differential pair 132

(transistors Q13 and Q14), the inphase signal noise (switching noise by the clock signal) can be removed or reduced.

Note that in the linear differential amplifier 130A, the emitter-follower circuit unit 131 is not a required component. If the linear differential amplifier 130A does not include the emitter-follower circuit unit 131, the bases of the respective transistors Q13 and Q14 forming the differential pair 132 of the differential amplifier circuit unit will be directly connected to the input terminals IN+ and IN−.

In addition, if an additional linear differential amplifier 130A is to be further provided on a stage subsequent to the differential amplifier 130A, the output terminals OUT+ and OUT− of the preceding-stage linear differential amplifier 130A will be connected to the input terminals IN+ and IN− of the subsequent-stage linear differential amplifier 130A.

<Second Detailed Arrangement Example of Linear Differential Amplifier 130>

Figure 6:
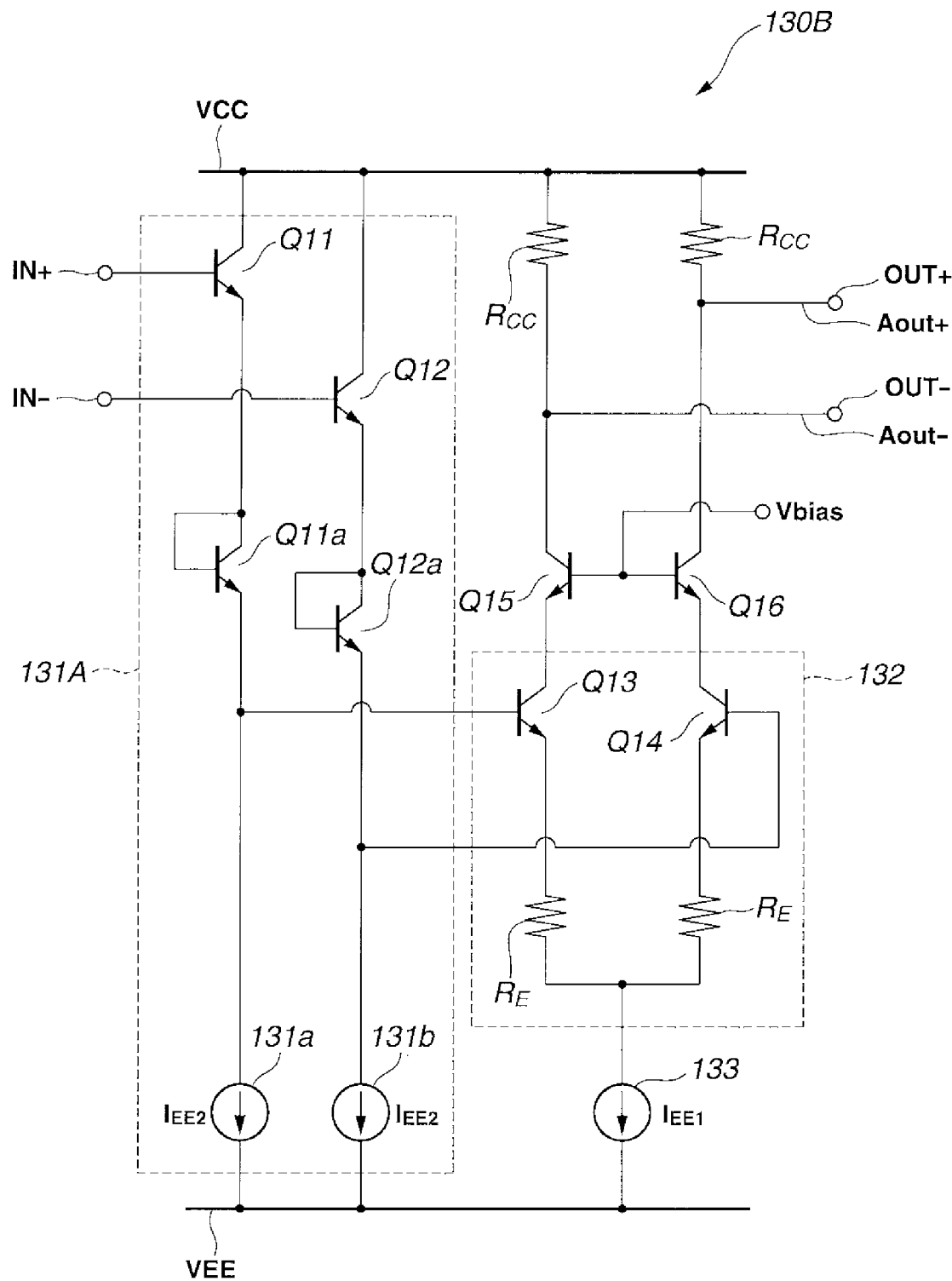
FIG. 6 is a circuit diagram showing a second detailed arrangement example of a linear differential amplifier.

FIG. 6 shows a linear differential amplifier 130B which is the second detailed arrangement example that can be used as the differential amplifier 130 shown in FIG. 1. The linear differential amplifier 130B is a modification of the linear differential amplifier 130A shown in FIG. 5. Hence, in the linear differential amplifier 130B, only parts that have been added to the linear differential amplifier 130A will be described.

A transistor Q11a whose collector is connected to its base has been added to the emitter-follower circuit of the first system in an emitter-follower circuit unit 131A. The collector and the base of the transistor Q11a are connected to the emitter of the transistor Q11, and the emitter of the transistor Q11a is connected to one terminal of the constant current source 131a. A transistor Q12a whose collector is connected to its base has been added to the emitter-follower circuit of the second system. The collector and the base of this transistor Q12a are connected to the emitter of the transistor Q12, and the emitter of the transistor Q12a is connected to one terminal of the constant current source 131b. The transistors Q11a and Q12a function as the first and second diodes and are used to decrease the DC-shift level.

In the differential amplifier circuit unit, a transistor (ninth transistor) Q15 is cascode-connected to the transistor Q13, and a transistor (tenth transistor) Q16 is cascode-connected to the transistor Q14. The emitters of the transistors Q15 and Q16 are connected to the collectors of the transistors Q13 and Q14, respectively, and the collectors of the transistors Q15 and Q16 are connected to the output terminals OUT− and OUT+, respectively. The bases of the transistors Q15 and Q16 are connected to a bias voltage Vbias and are grounded in an AC manner. That is, the bases of the transistors Q15 and Q16 have been grounded. By cascode-connecting the base-grounded transistors Q15 and Q16 to the emitter-grounded transistors Q13 and Q14, a mirror effect (a phenomenon in which the parasitic capacitance between the base and the collector is a multiple of a gain) can be suppressed in the transistors Q13 and Q14.

Other parts of the linear differential amplifier 130B are the same as those in the linear differential amplifier 130A shown in FIG. 5.

Note that it is possible to apply the linear differential amplifiers 130A and 130B shown in FIGS. 5 and 6 to the linear buffers 111 and 112 (see FIG. 1) arranged on the first stage of the analog input signal so as to achieve impedance matching. Furthermore, it is possible to apply the linear differential amplifiers 130A and 130B shown FIGS. 5 and 6 to the clock signal buffer 140 (see FIG. 1). However, note that in the case of the clock signal buffer 140, linearity is not a particular concern and need not always satisfy equation (3).

The basic arrangement of the analog multiplexer circuit according to the first embodiment of the present invention has been described above. By using the analog multiplexer circuit, it is possible to time-multiplex an analog signal with low noise, high linearity, and high speed.

Second Embodiment

An extension technique of an analog multiplexer circuit according to the present invention will be described next as the second embodiment. In the above-described analog multiplexer circuit 100 according to the first embodiment, the amplitude of the analog signal, which is to be input to ensure the linearity of the operation of the multiplexer circuit, needs to be already known at the design stage. However, since the analog input amplitude (signal amplitude from the DAC) that is handled differs depending on the application, it is preferable, from the viewpoint of improving versatility, to be able to subsequently adjust the amplitude range to a range that can be supported to a certain extent. Additionally, it can further improve usability if the amplitude range can be adaptively and automatically adjusted. A circuit arrangement that can make this adjustment possible will be described as the second embodiment hereinafter.

Figure 7A:
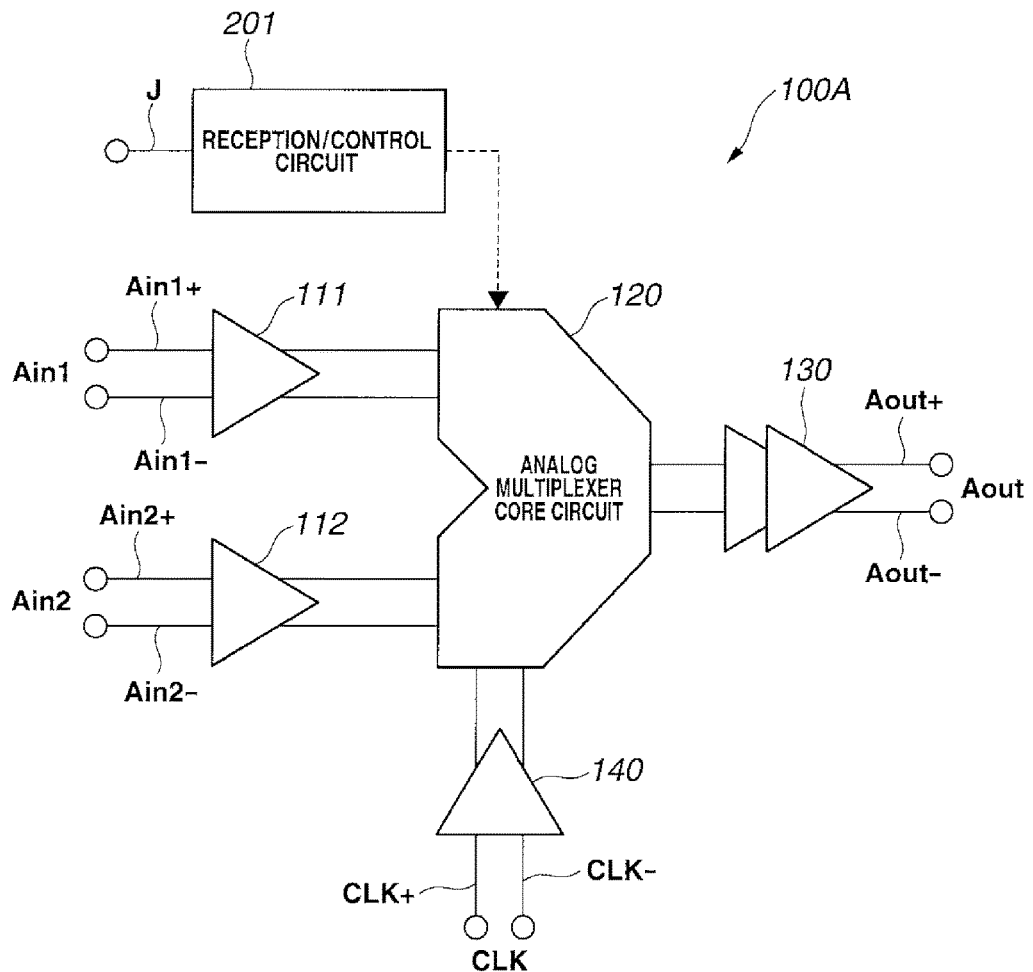
FIG. 7A is a block diagram showing an analog multiplexer circuit according to the second embodiment of the present invention.

An analog multiplexer circuit 100A according to the second embodiment that has an arrangement in which the linear response range can be adjusted by receiving an external signal is shown in FIG. 7A. The analog multiplexer circuit 100A is arranged so that amplitude information J which indicates the amplitude values of analog signals Ain1 and Ain2 to be input is input from the outside. As the detailed arrangement examples of an analog multiplexer core circuit 120 of the analog multiplexer circuit 100A, analog multiplexer core circuits 120C and 120D shown in FIGS. 8 and 9 (to be described later) have been adopted. The amplitude information J is input to a reception/control unit 201. Although details will be described later, the reception/control unit 201 receives the amplitude information J and performs control on the amplitudes of the analog signals Ain1 and Ain2 so as to satisfy the aforementioned equation (1). Note that the reception/control unit 201 can be formed from, for example, a circuit such as a voltage-to-voltage conversion circuit.

Figure 8:
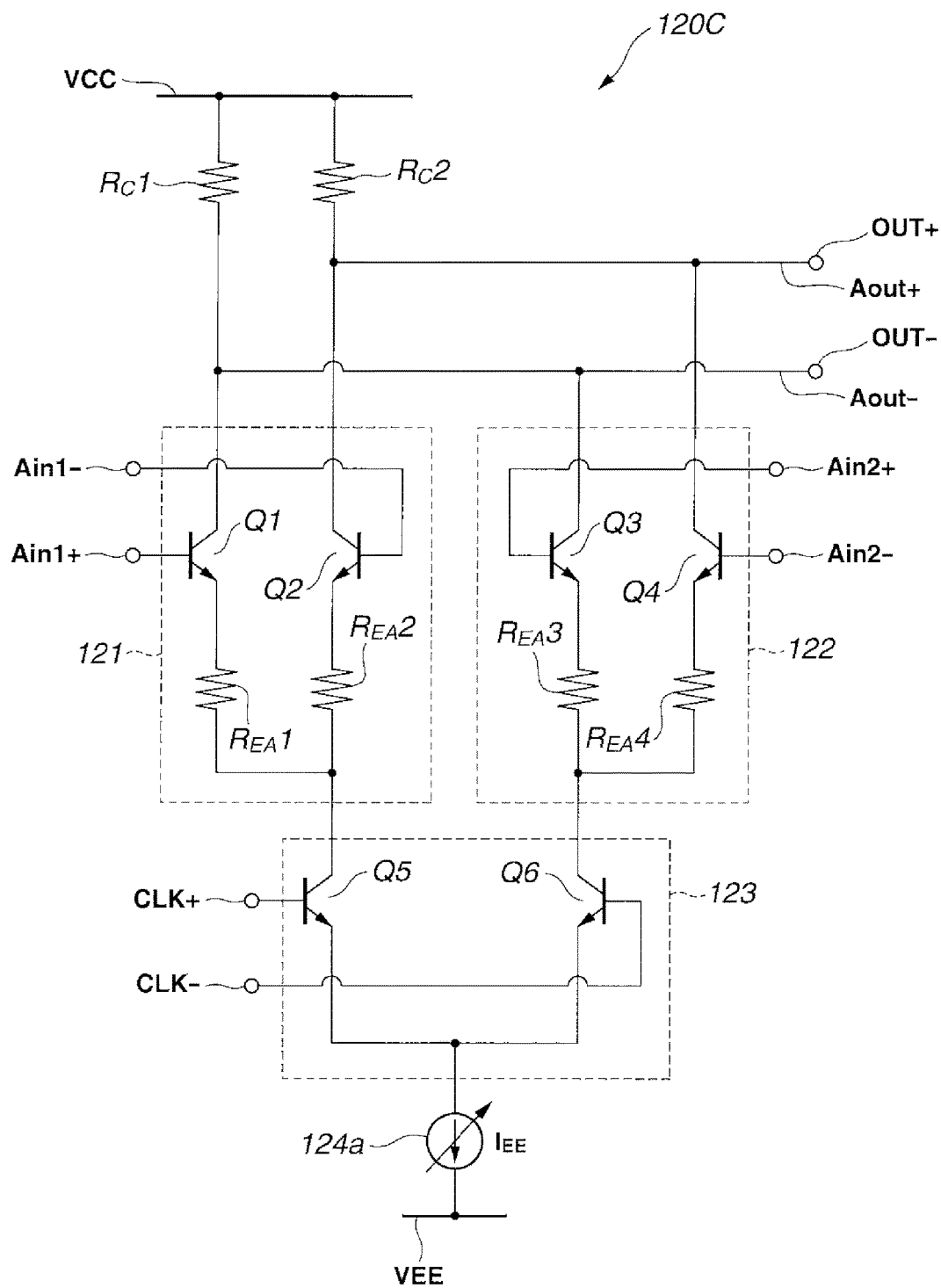
FIG. 8 is a circuit diagram showing a third detailed arrangement example of the analog multiplexer core circuit.
Figure 9:
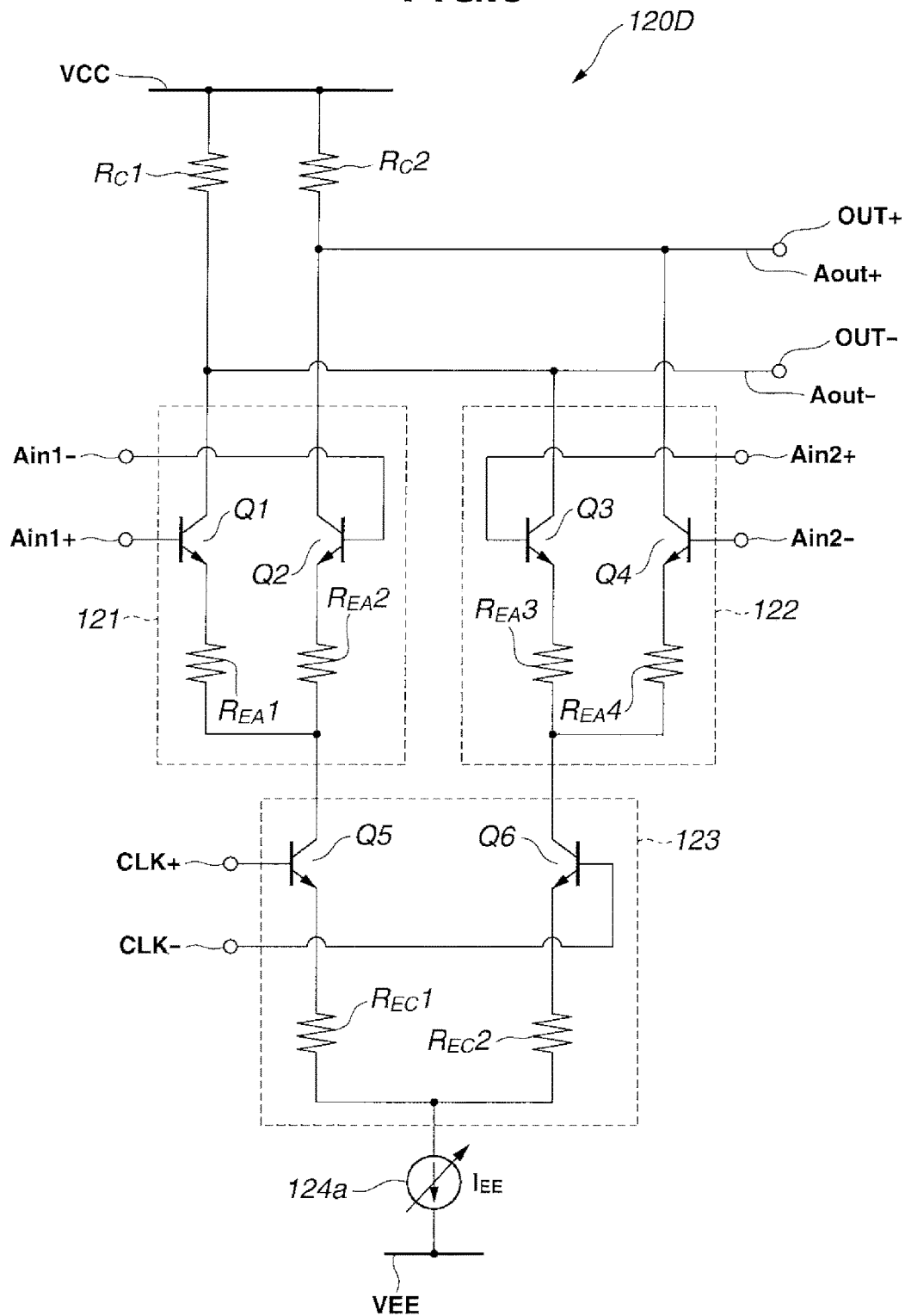
FIG. 9 is a circuit diagram showing a fourth detailed arrangement example of the analog multiplexer core circuit.

The analog multiplexer core circuit 120C shown in FIG. 8 is a circuit in which a constant current source 124, which was adopted in an analog multiplexer core circuit 120A shown in FIG. 2, has been changed to a variable current source 124a. The analog multiplexer core circuit 120D shown in FIG. 9 is a circuit in which the constant current source 124, which was adopted in an analog multiplexer core circuit 120B shown in FIG. 4, has been changed to a variable current source 124a.

Figure 7B:
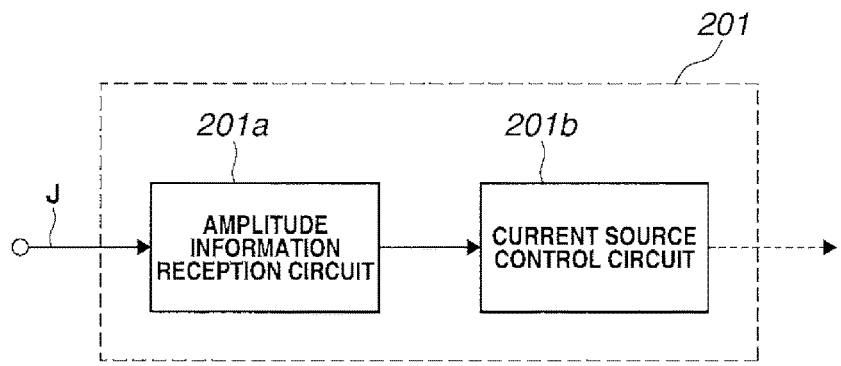
FIG. 7B is a block diagram showing a reception/control circuit of an analog multiplexer core circuit.

As shown in FIG. 7B, the reception/control unit 201 includes an amplitude-information reception circuit 201a and a current source control unit 201b. The amplitude-information reception circuit 201a is a circuit that receives the amplitude information J indicating the amplitude values of the analog signals Ain1 and Ain2 input from the outside and outputs the amplitude information J to the current source control unit 201b. The current source control unit 201b is a circuit that causes the variable current sources 124a of the respective analog multiplexer core circuits 120C and 120D to cause a current $I_{EE}$ satisfying the aforementioned equation (1) or equations (1) and (2) to flow in accordance with the amplitude values of the analog signals Ain1 and Ain2 indicated by the amplitude information J.

That is, upon receiving the amplitude information J that indicates the amplitude values of the analog signals Ain1 and Ain2, the reception/control unit 201 controls the current value of each of the variable current sources 124a of the analog multiplexer core circuits 120C and 120D and sets each current value $I_{EE}$ so as to satisfy equation (1) or equations (1) and (2) with respect to the amplitudes of the input analog signals. The linear response range is adjusted by performing such control.

Third Embodiment

Figure 10A:
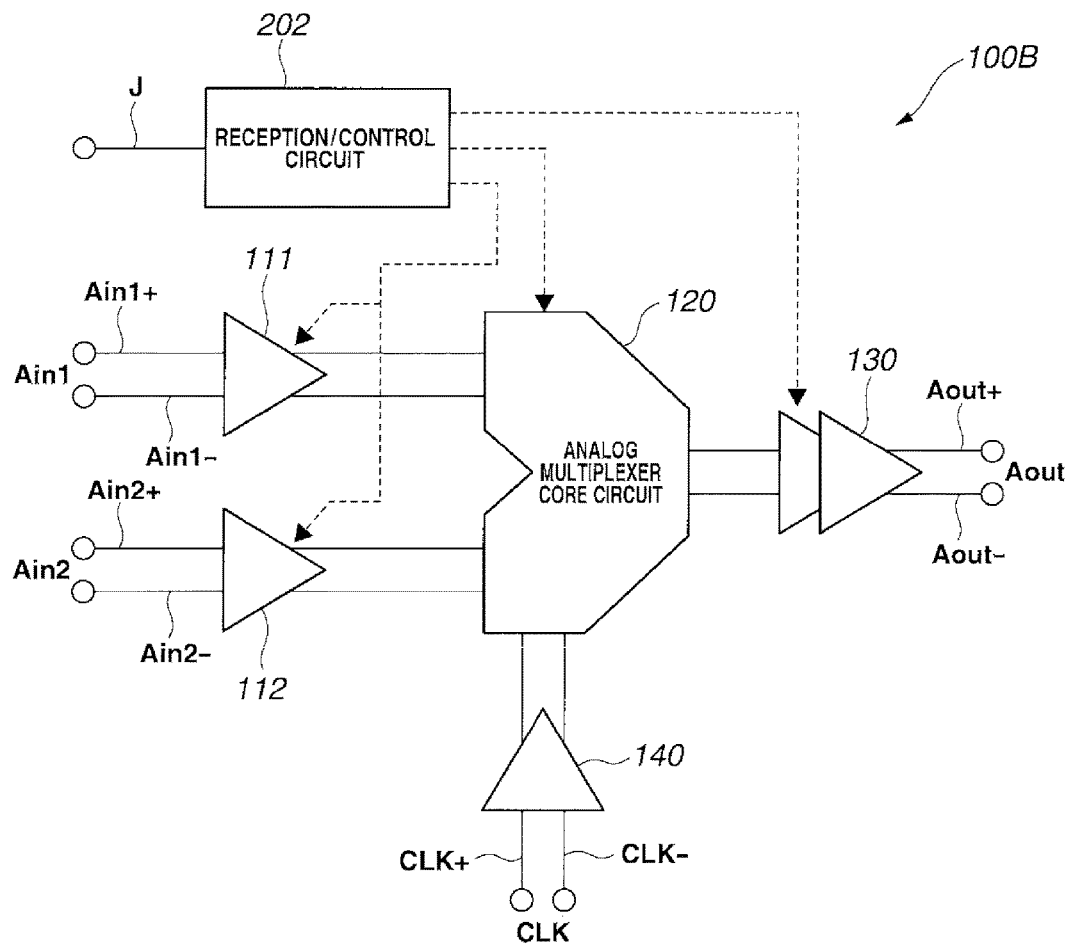
FIG. 10A is a block diagram showing an analog multiplexer circuit according to the third embodiment of the present invention.

An analog multiplexer circuit 100B according to the third embodiment shown in FIG. 10A includes a variable current source in almost all of the component blocks and has an arrangement in which the linear response range can be adjusted. That is, as an analog multiplexer core circuit 120, analog multiplexer core circuits 120C and 120D shown in the above-described FIGS. 8 and 9 are used. As linear differential amplifiers 130 and linear buffers 111 and 112, linear differential amplifiers 130C and 130D shown in FIGS. 11 and 12 (to be described later) are used.

Figure 11:
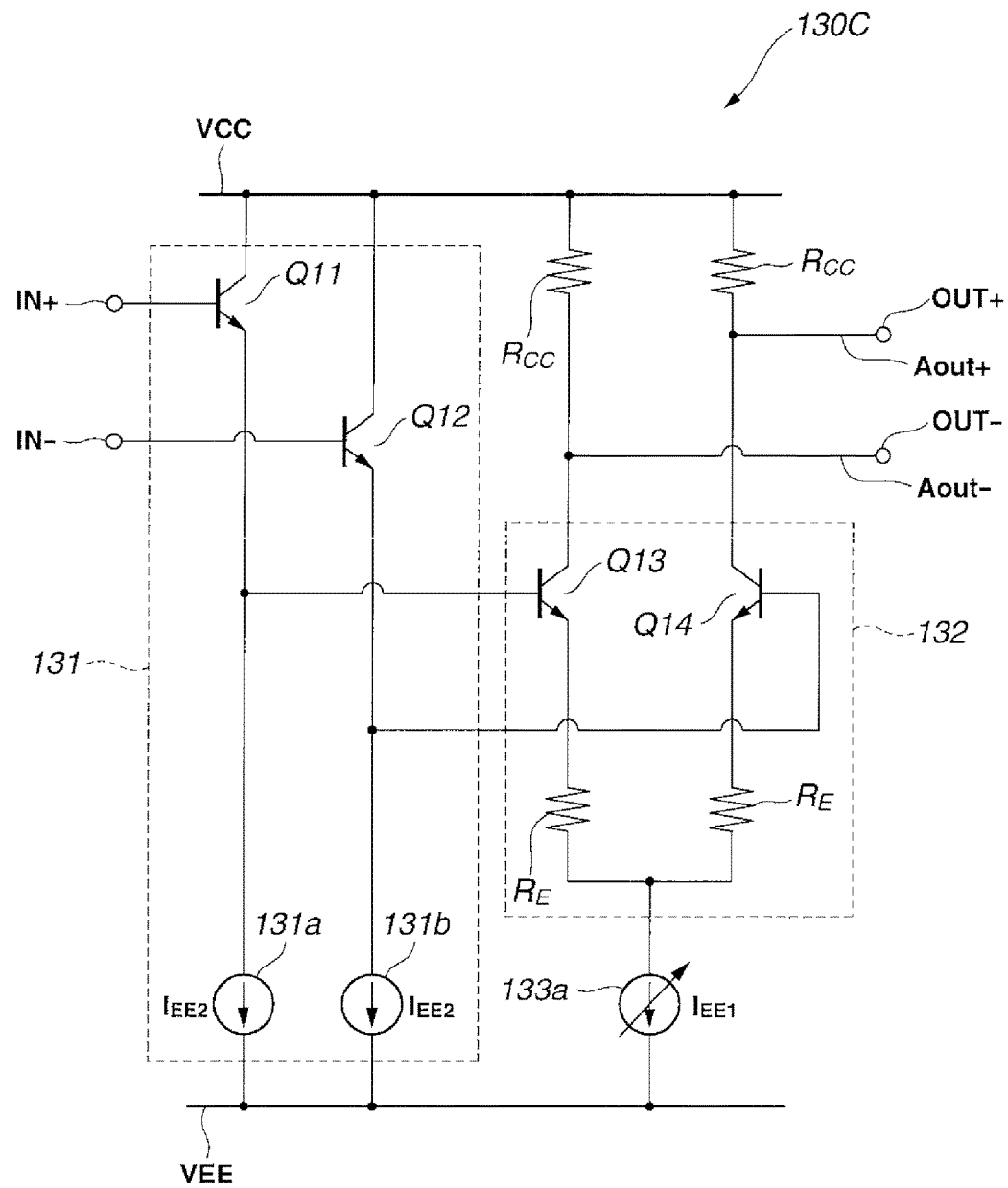
FIG. 11 is a circuit diagram showing a third detailed arrangement example of a linear differential amplifier.
Figure 12:
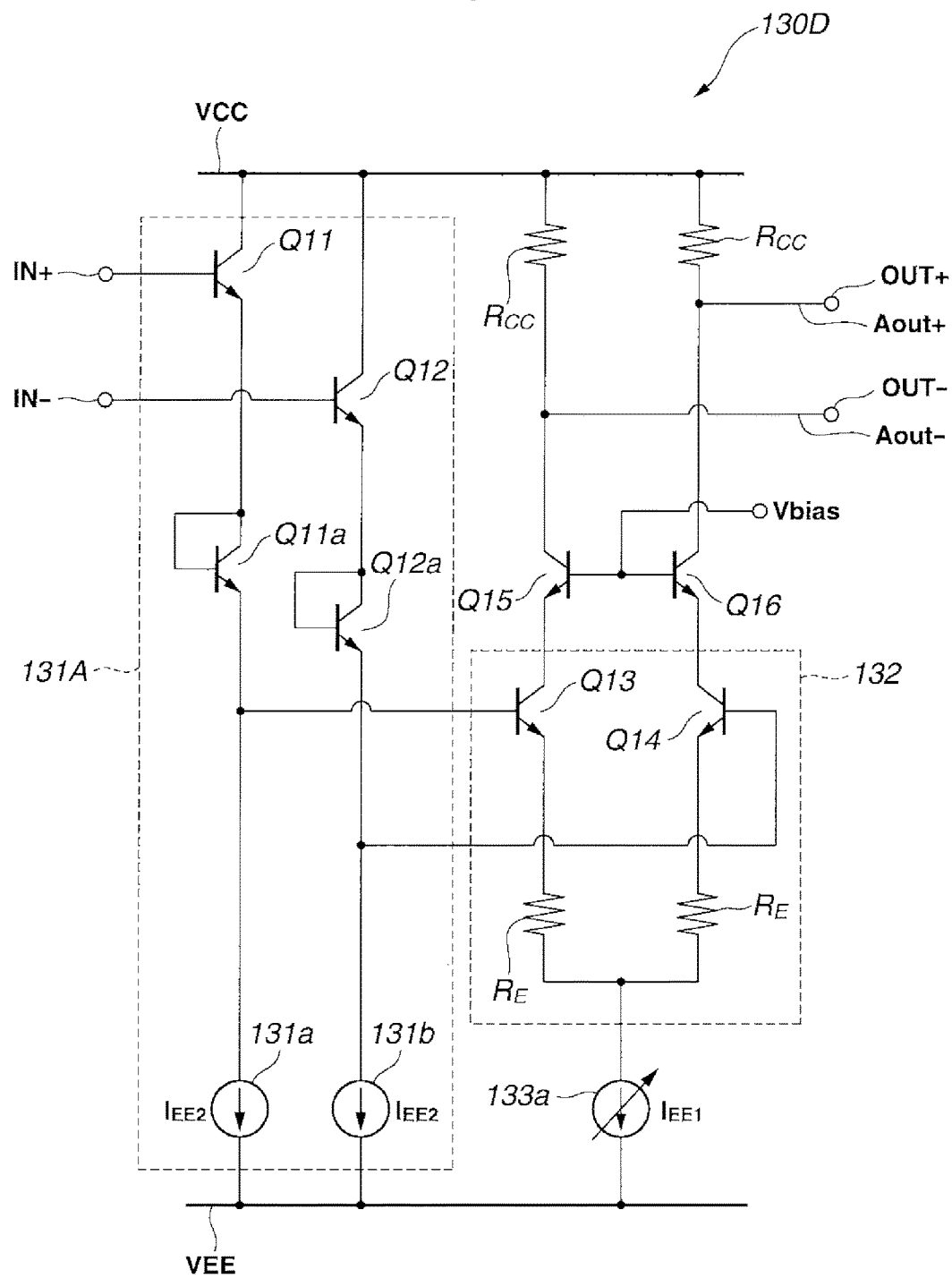
FIG. 12 is a circuit diagram showing a fourth detailed arrangement example of the linear differential amplifier.

The linear differential amplifier 130C shown in FIG. 11 is an amplifier in which a constant current source 133, which had been adopted in a linear differential amplifier 130A shown in FIG. 5, has been changed to a variable current source 133a. The linear differential amplifier 130D shown in FIG. 12 is an amplifier in which a constant current source 133, which had been adopted in a linear differential amplifier 130B shown in FIG. 6, has been changed to a variable current source 133a.

Figure 10B:
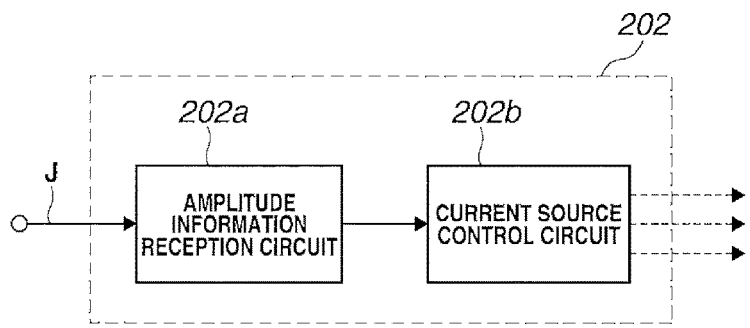
FIG. 10B is a block diagram showing a reception/control circuit of the analog multiplexer circuit.

As shown in FIG. 10B, a reception/control unit 202 includes an amplitude-information reception circuit 202a and a current source control circuit 202b. The amplitude-information reception circuit 202a is the same circuit as an amplitude-information reception circuit 201a of FIG. 7B. The current source control circuit 202b is a circuit which causes the variable current sources 124a of the analog multiplexer core circuits 120C and 120D to cause a current $I_{EE}$ satisfying the aforementioned equation (1) or equations (1) and (2) to flow in accordance with the amplitude values of analog signals Ain1 and Ain2 indicated by amplitude information J and causes the variable current sources 133a of each differential amplifier 130 and the linear buffers 111 and 112 to cause the current $I_{EE}$ satisfying the aforementioned equation (3) to flow.

That is, upon receiving the amplitude information J indicating the amplitudes of the analog signals Ain1 and Ain2, the reception/control unit 202 controls the value of the current flowing in each of the variable current sources 124a of the respective analog multiplexer core circuits 120C and 120D and sets the current value $I_{EE}$ so that equation (1) or equations (1) and (2) are satisfied with respect to the amplitudes of the input analog signals. Also, upon receiving the amplitude information J indicating the amplitude values of the analog signals Ain1 and Ain2, the reception/control unit 202 controls the value of the current flowing in each of the variable current sources 133a of each differential amplifier 130 and the linear buffers 111 and 112 and sets the current value $I_{EE1}$ to satisfy equation (3) with respect to the amplitudes of the analog signals to be input. By performing such control, the linear response range in almost all of the component blocks is adjusted.

Note that in the example of FIG. 10A, a control signal is not supplied to a clock signal buffer 140 for which linearity is unimportant. However, control may be performed by setting an arrangement in which a variable current source is provided also for the clock signal buffer 140 as needed.

Fourth Embodiment

Figure 13A:
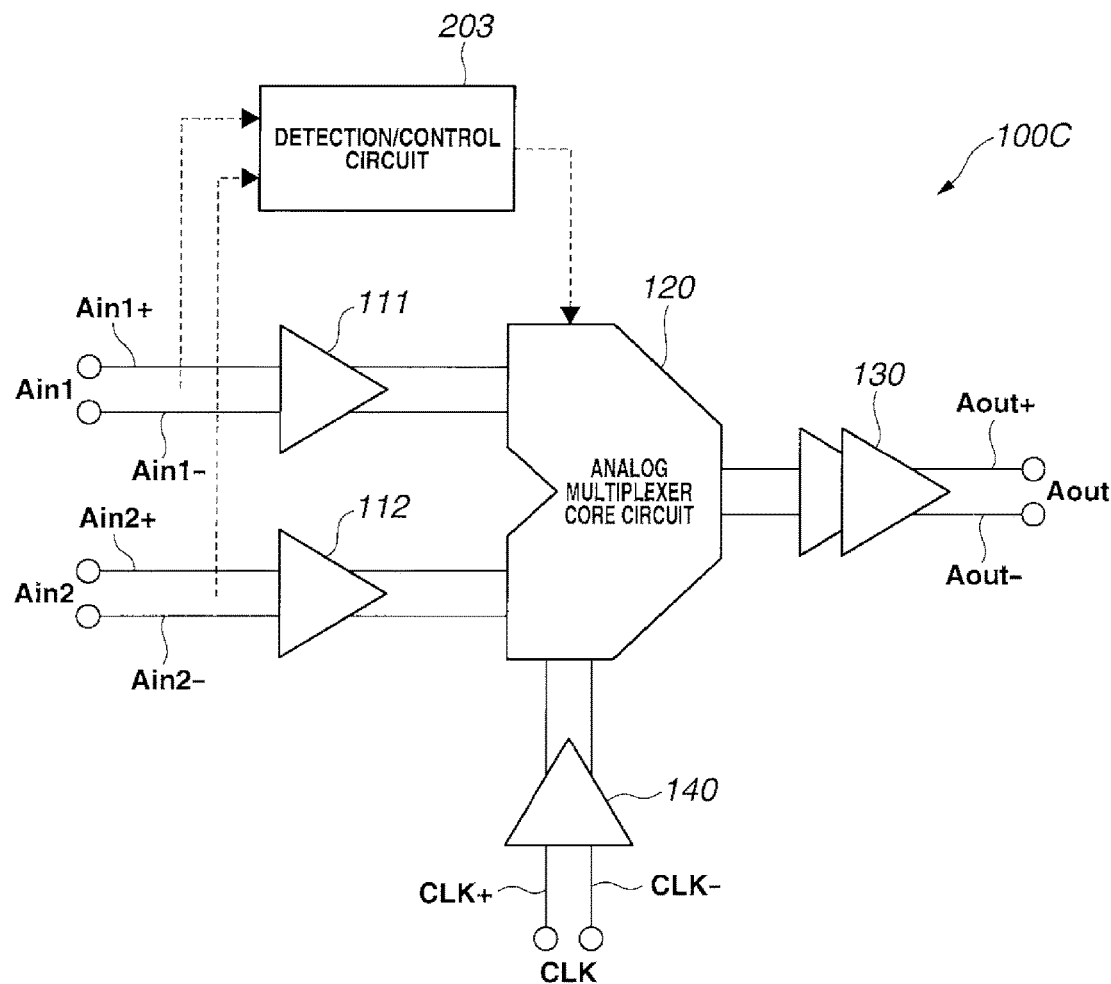
FIG. 13A is a block diagram showing an analog multiplexer circuit according to the fourth embodiment of the present invention.
Figure 14A:
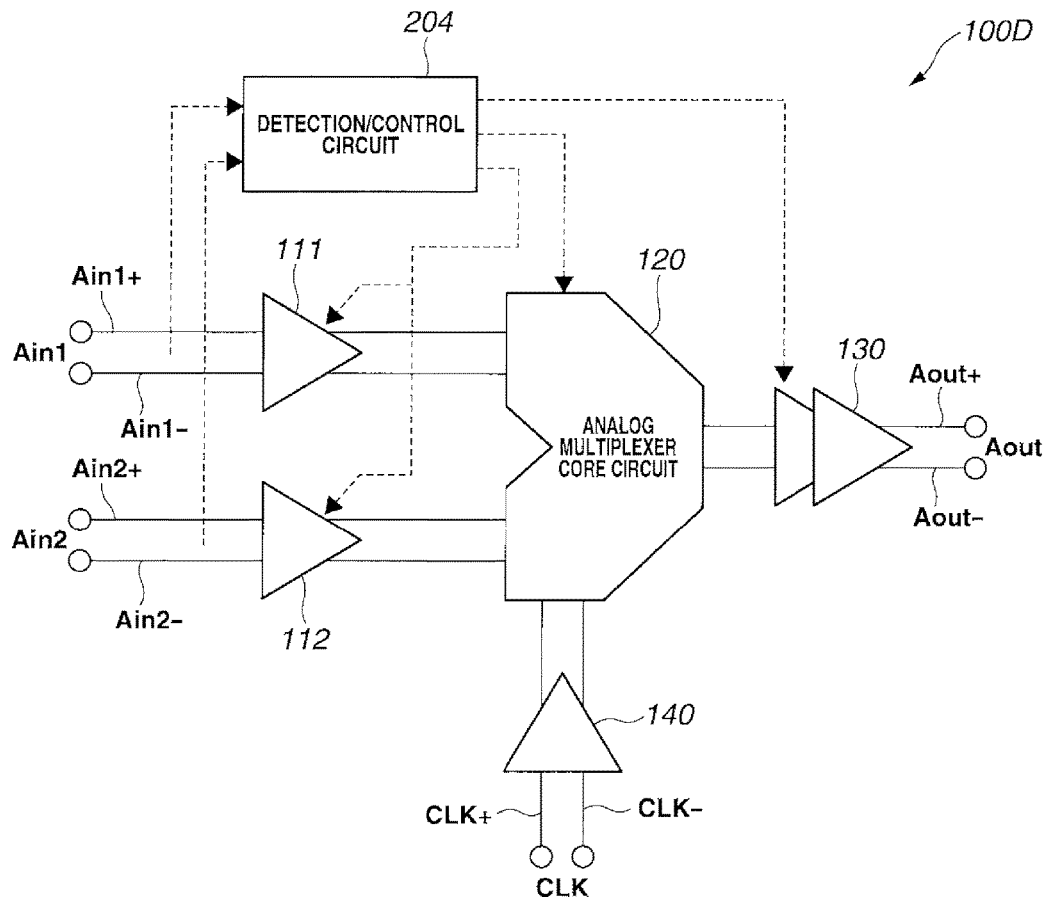
FIG. 14A is a block diagram showing another example of the analog multiplexer circuit according to the fourth embodiment of the present invention.

FIGS. 13A and 14A show analog multiplexer circuits 100C and 100D, respectively, according to the fourth embodiment that automatically detect amplitudes of input analog signals Ain1 and Ain2 to adjust a variable current source.

Figure 13B:
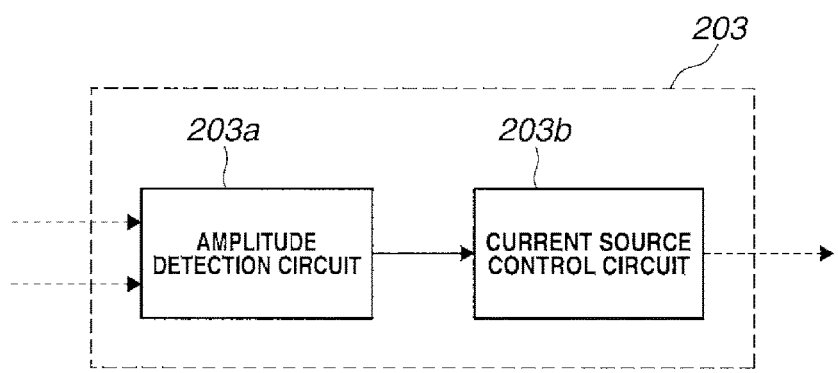
FIG. 13B is a block diagram showing a detection/control circuit of the analog multiplexer circuit.

The analog multiplexer circuit 100C shown in FIG. 13A is a circuit in which a reception/control unit 201 that was adopted in an analog multiplexer circuit 100A shown in FIG. 7A has been changed to a detection/control circuit 203. As shown in FIG. 13B, the detection/control circuit 203 includes an amplitude detection circuit 203a and a current source control circuit 203b. The amplitude detection circuit 203a is a circuit that is formed from an IC, detects an amplitude value (peak value) of each of the analog signals Ain1 and Ain2, and outputs amplitude information J indicating an amplitude value to the current source control circuit 203b. The current source control circuit 203b is the same circuit as a current source control unit 201b of FIG. 7B. That is, the detection/control circuit 203 detects the amplitude values (peak values) of the respective input analog signals Ain1 and Ain2 inside the IC and adjusts a current $I_{EE}$ which is to flow in a variable current source 124a (see FIGS. 8 and 9) of an analog multiplexer core circuit 120.

Figure 14B:
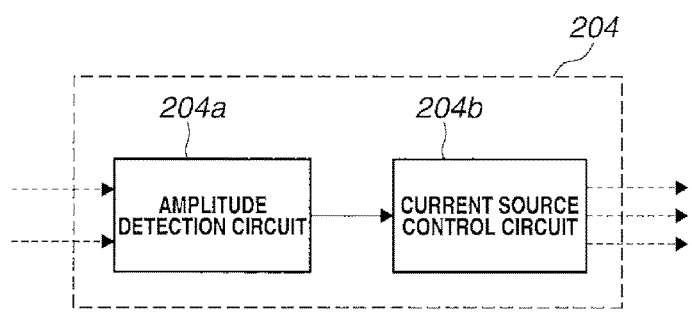
FIG. 14B is a block diagram showing the detection and control circuit of the analog multiplexer circuit.

The analog multiplexer circuit 100D shown in FIG. 14A is a circuit in which a reception/control unit 202 that was adopted in an analog multiplexer circuit 100B shown in FIG. 10A has been changed to a detection/control circuit 204. As shown in FIG. 14B, the detection/control circuit 204 includes an amplitude detection circuit 204a and a current source control circuit 204b. The amplitude detection circuit 204a is the same circuit as an amplitude detection circuit 203a of FIG. 13B. The current source control circuit 204b is the same circuit as a current source control circuit 202b of FIG. 10B. That is, the detection/control circuit 204 detects the amplitudes (peak values) of the respective input analog signals Ain1 and Ain2 inside the IC and adjusts the current $I_{EE}$ which is to flow in the variable current source 124a (see FIGS. 8 and 9) of the analog multiplexer core circuit 120, and adjusts a current $I_{EE}$ which is to flow to variable current sources 133a (see FIGS. 11 and 12) of each differential amplifier 130 and linear buffers 111 and 112.

In this manner, by setting the value of the variable current source in each block of the analog multiplexer circuits 100C and 100D, the linear response range can be automatically adjusted adaptively.

Fifth Embodiment

Figure 15:
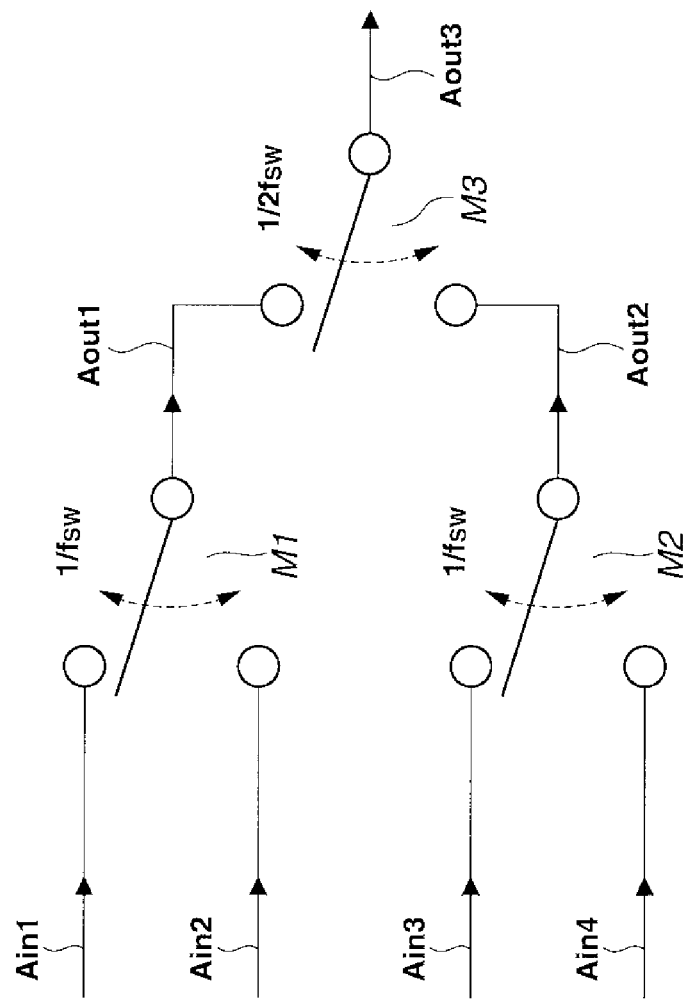
FIG. 15 is a conceptual view showing an example in which analog multiplexer core circuits are cascade-connected in a tree structure.
Figure 16:
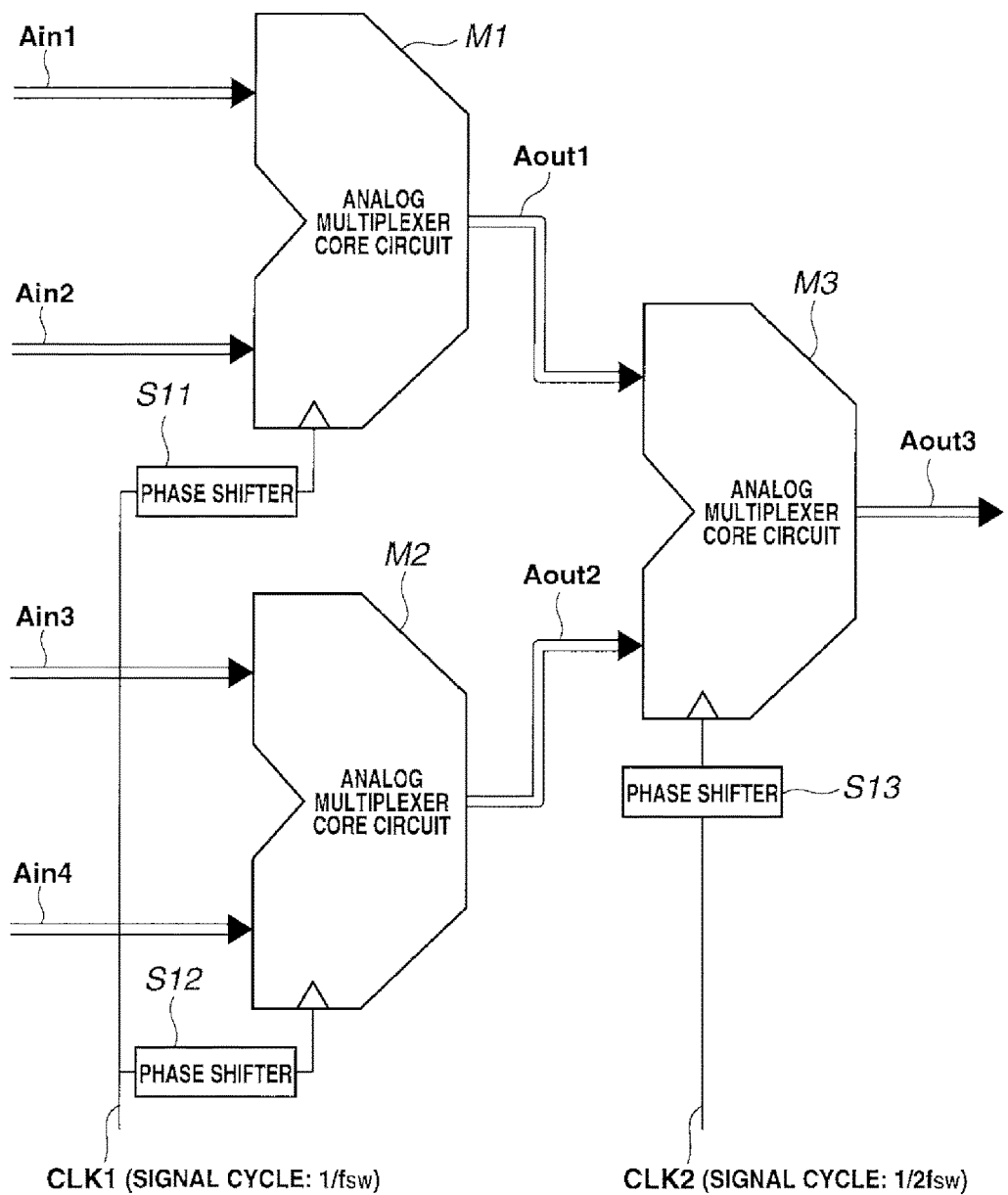
FIG. 16 is a block diagram showing an example in which the analog multiplexer core circuits are cascade-connected in a tree structure.

The above described analog multiplexer circuits 100, 100A, 100B, 100C, and 100D all are circuits that time-multiplex two analog signals into one signal. To expand the system for two or more signals, the aforementioned analog multiplexer (core) circuits can be cascade-connected in a tree structure as shown in FIGS. 15 and 16. However, in this case, since a subsequent-stage analog multiplexer needs to operate at a cycle which is two times that of a preceding-stage analog multiplexer, a clock frequency that is to be input to the subsequent stage becomes two times as that of a clock frequency to be input to the preceding stage.

FIG. 15 is a conceptual view, and FIG. 16 is a block diagram. An analog multiplexer core circuits M1, M2, and M3 represent the aforementioned analog multiplexer core circuits 120, 120A, 120B, 120C, and 120D (or analog multiplexer circuits 100, 100A, 100B, 100C, and 100D including the analog multiplexer core circuits 120, 120A, 120B, 120C, and 120D). In this example, two analog multiplexer core circuits M1 and M2 are arranged on the first stage and one analog multiplexer core circuit M3 is arranged on the second stage.

Two analog signals Ain1 and Ain2 and a clock signal (first clock signal) CLK1 (signal cycle: 1/fsw) whose phase is shifted by 0° by a phase shifter S11 are input to the analog multiplexer core circuit (first analog multiplexer core circuit) M1. A time-multiplexed analog signal Aout1 is output from the analog multiplexer core circuit M1.

Two analog signals Ain3 and Ain4, which are different from the two analog signals Ain1 and Ain2, and the clock signal (first clock signal) CLK1 (signal cycle: 1/fsw) whose phase is shifted by 180° by a phase shifter S12 are input to the analog multiplexer core circuit (second analog multiplexer core circuit) M2. Note that it is sufficient as long as the clock signal CLK1 is input to the analog multiplexer core circuit M2 at a phase different from that of the analog multiplexer core circuit M1. A time-multiplexed analog signal Aout2 is output from the analog multiplexer core circuit M2.

Two time-multiplexed analog signals Aout1 and Aout2 and a clock signal (second clock signal) CLK2 (signal cycle: ½ fsw) whose phase is shifted by a phase shifter S13 are input to the analog multiplexer core circuit (third analog multiplexer core circuit) M3. A time-multiplexed analog signal Aout3 is output from the analog multiplexer core circuit M3. By executing such a processing operation, the time-multiplexed analog signal Aout3 becomes a signal obtained by time-multiplexing four analog signals Ain1, Ain2, Ain3, and Ain4.

Effects of Embodiments

The effects of the aforementioned embodiments will be described. The linearity of each of the analog multiplexer core circuits 120, 120A, 120B, 120C, and 120D is greatly improved by setting an arrangement that satisfies equation (1). The effect (simulation result) is shown in FIGS. 17A, 17B, 17C and 17D.

Figure 17A:
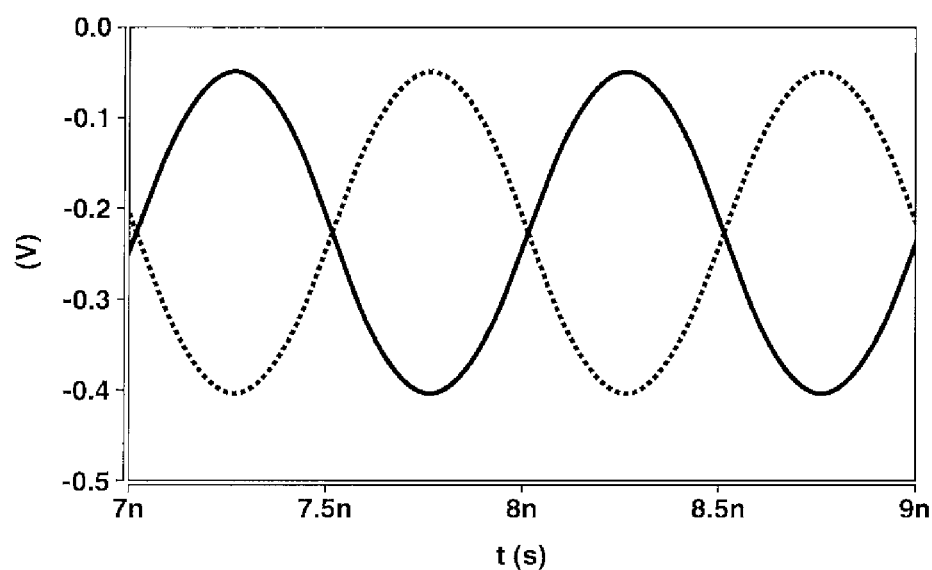
FIGS. 17A, 17B, 17C and 17D are charts showing waveform response characteristics of a sine wave (1 GHz)
Figure 17B:
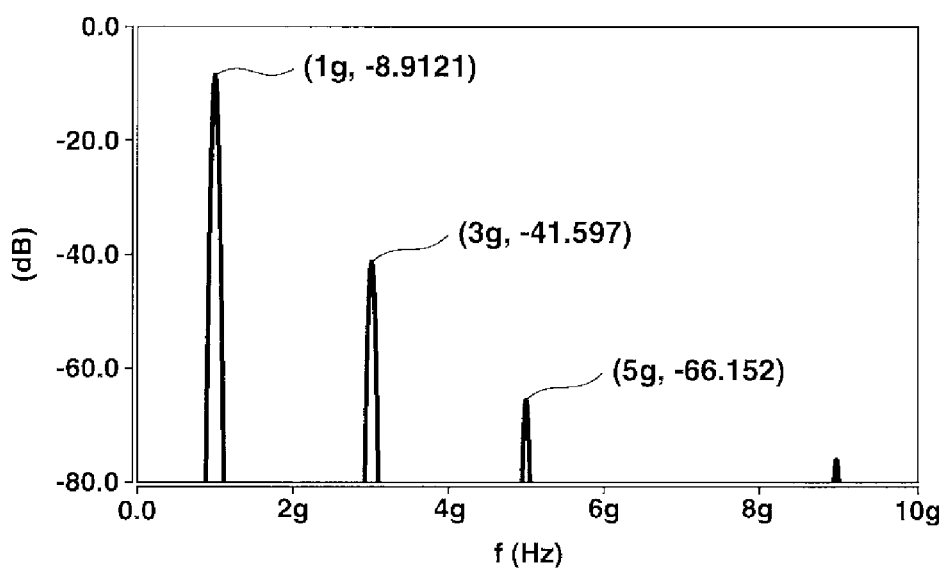
Figure 17C:
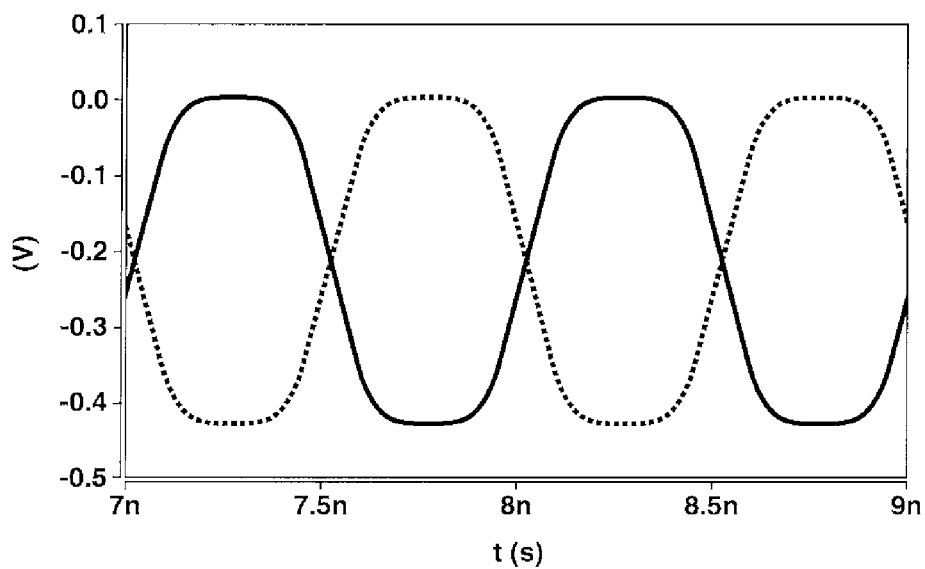
Figure 17D:
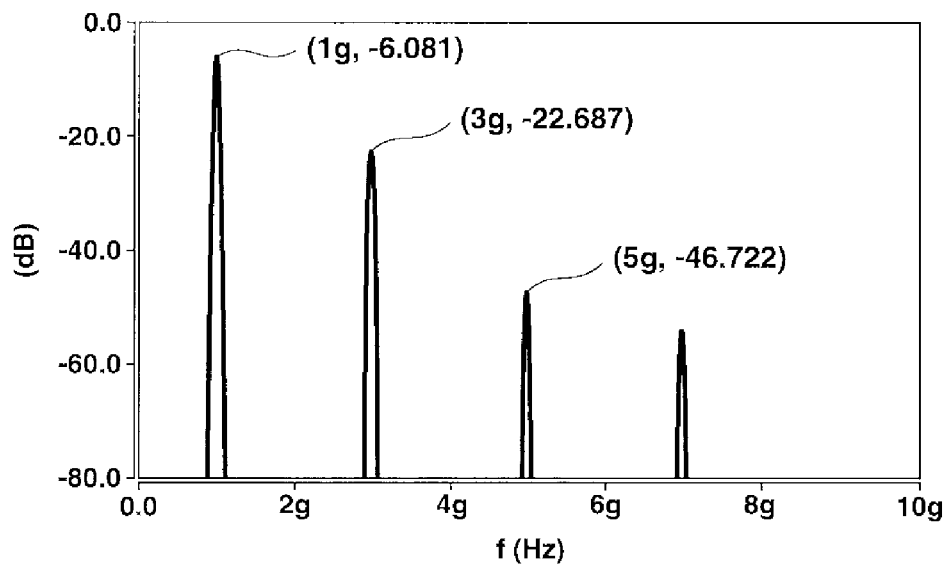

FIGS. 17A, 17B, 17C and 17D show the waveform response characteristics (simulation results) when a sine wave (1 GHz) is input as an input signal in cases that satisfy equation (1) and those that do not. That is, FIG. 17A shows a time-waveform characteristic chart for a case that satisfies equation (1), FIG. 17B shows a spectrum characteristic chart for a case that satisfies equation (1), FIG. 17C shows a time-waveform characteristic chart for a case that does not satisfy equation (1), FIG. 17D shows spectrum characteristics for a case that does not satisfy equation (1). As can be confirmed from these waveforms, the output wave form is distorted largely from the sine wave in a case that does not satisfy equation (1) while waveform distortion is small in an arrangement that satisfies equation (1). This can also be confirmed from the fact that harmonic distortion on the spectrum has been suppressed.

Figure 18A:
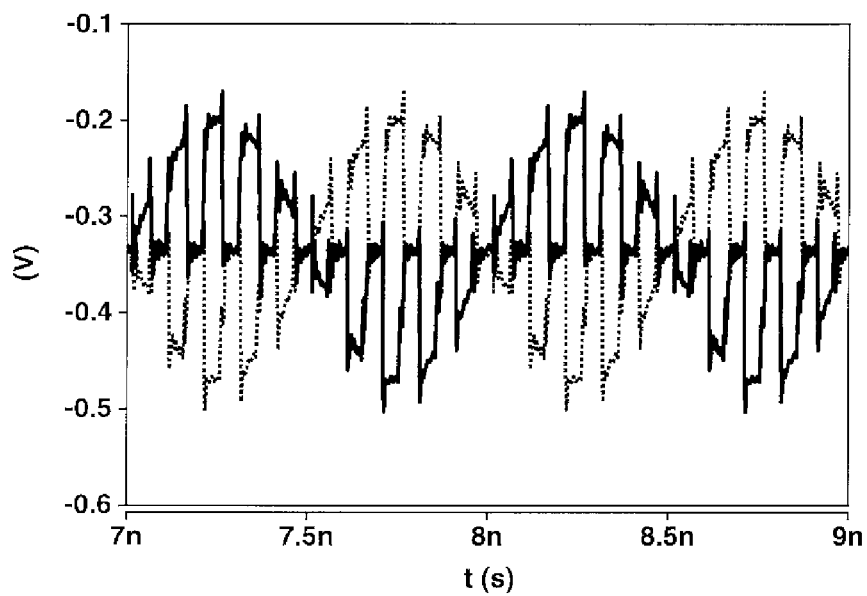
FIGS. 18A, 18B. 18C and 18D are charts showing the characteristics of an analog multiplexer core circuit.
Figure 18B:
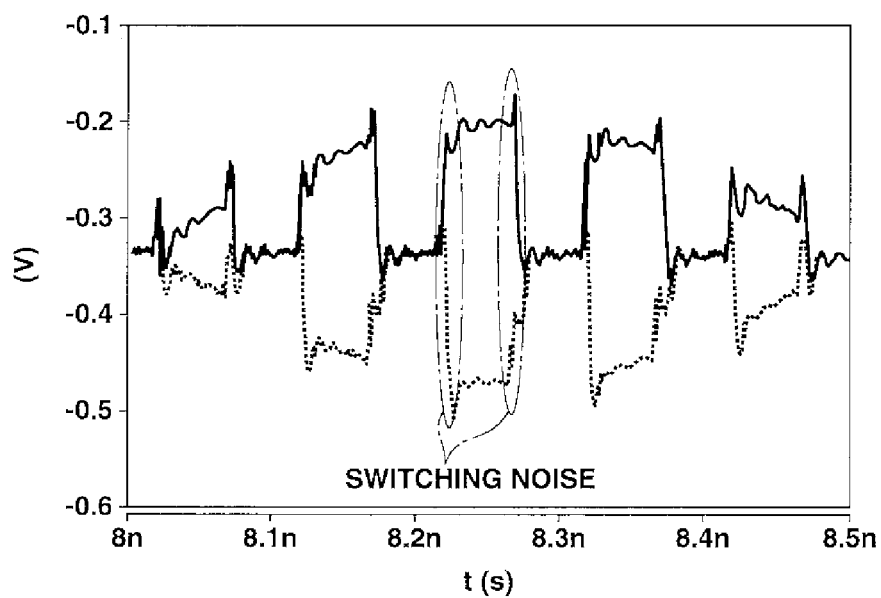
Figure 18C:
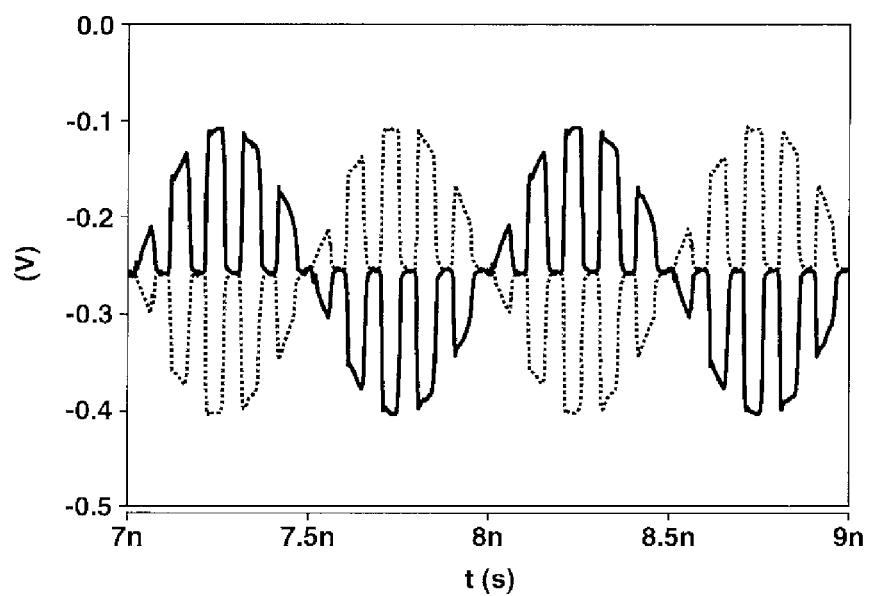
Figure 18D:
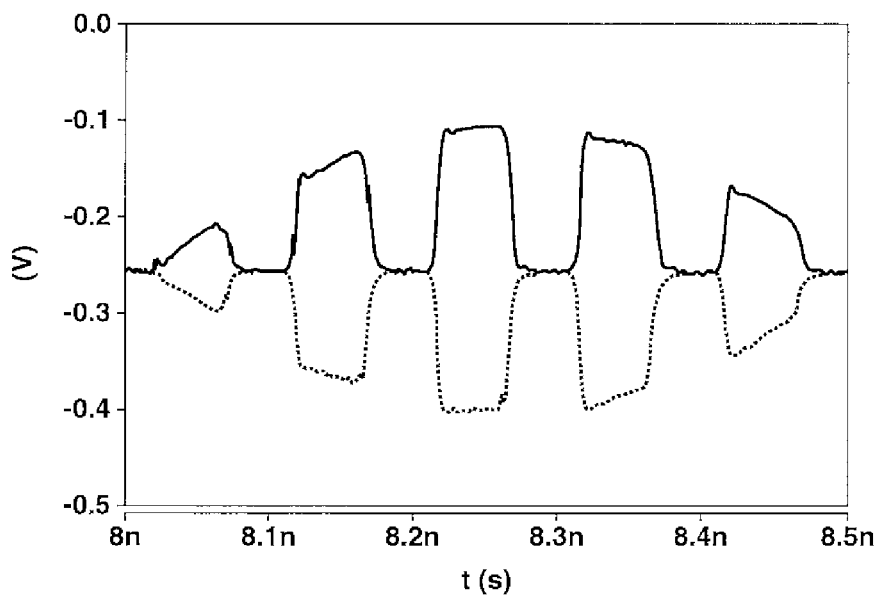
Figure 19:
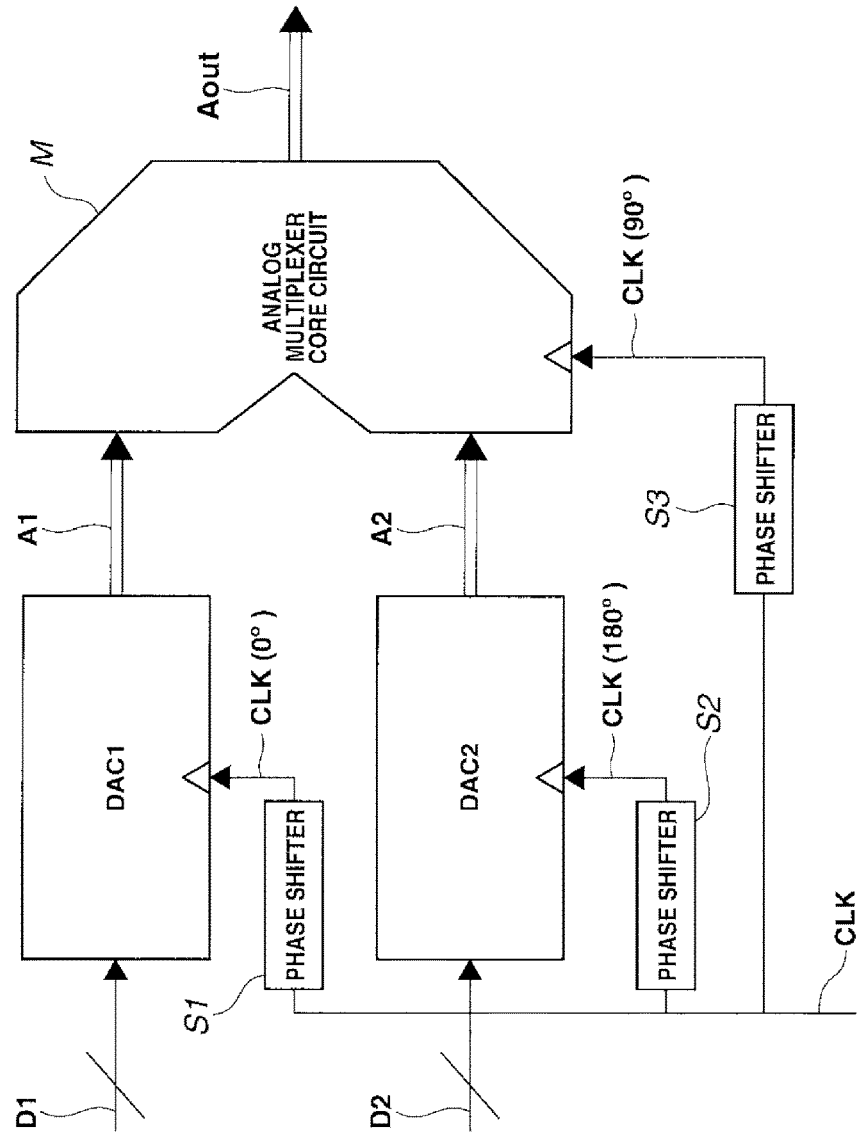
FIG. 19 is a block diagram showing a time-interleaved digital-to-analog conversion apparatus.
Figure 20:
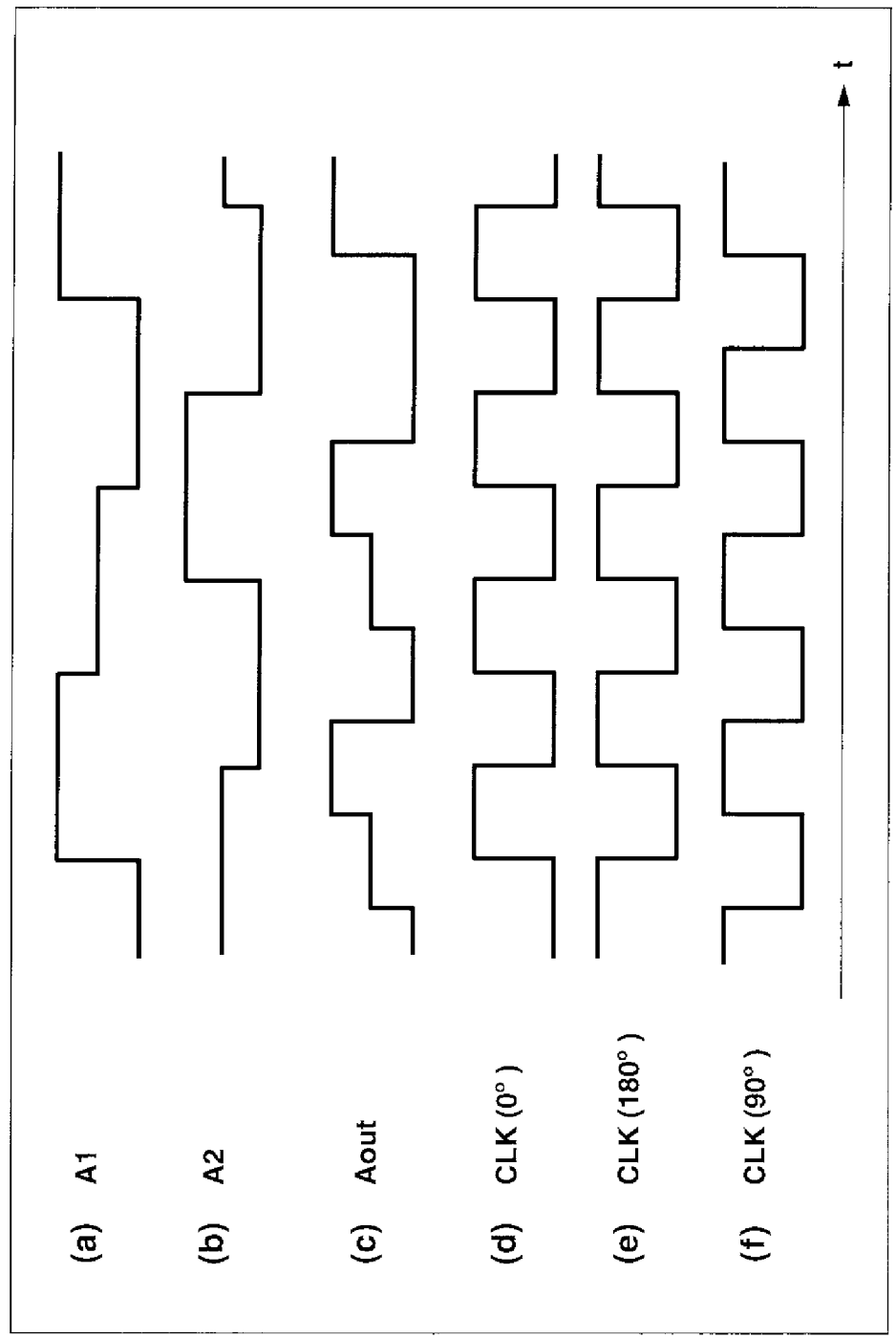
FIG. 20 is a timing chart showing signal waveforms in a digital-to-analog conversion apparatus.
Figure 21:
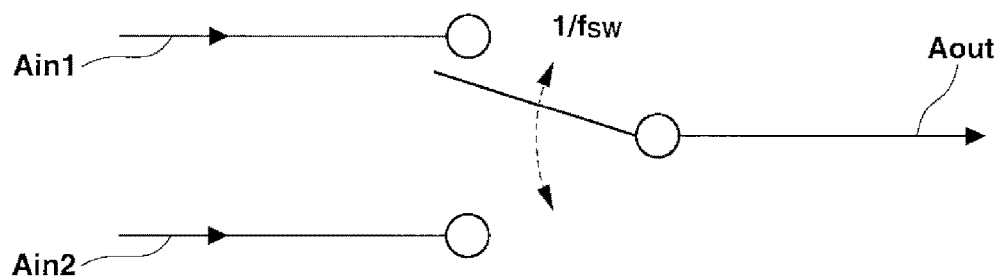
FIG. 21 is an arrangement diagram functionally showing an analog multiplexer.
Figure 22:
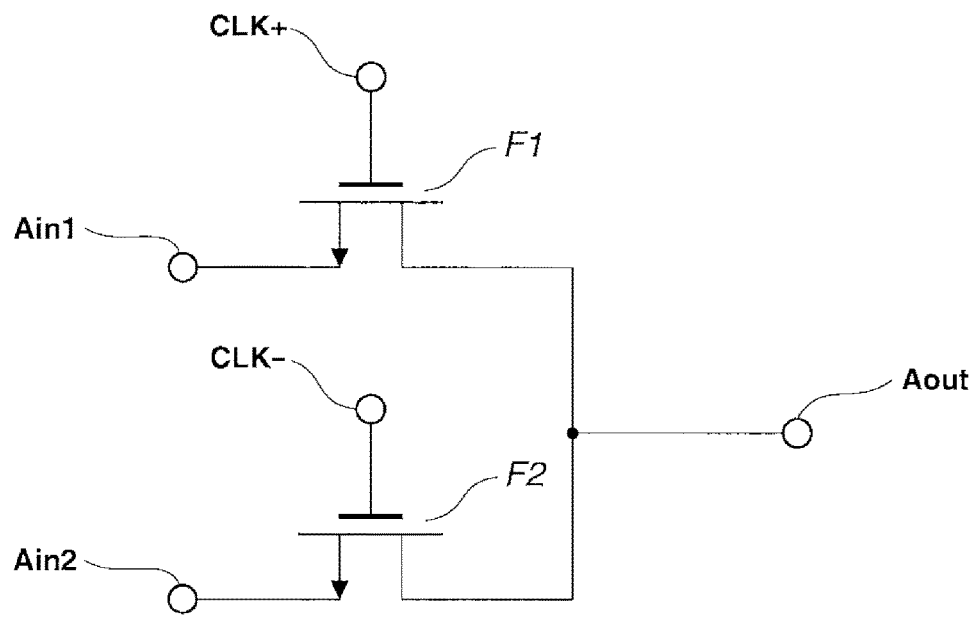
FIG. 22 is a circuit diagram showing a general analog multiplexer core circuit.
Figure 23:
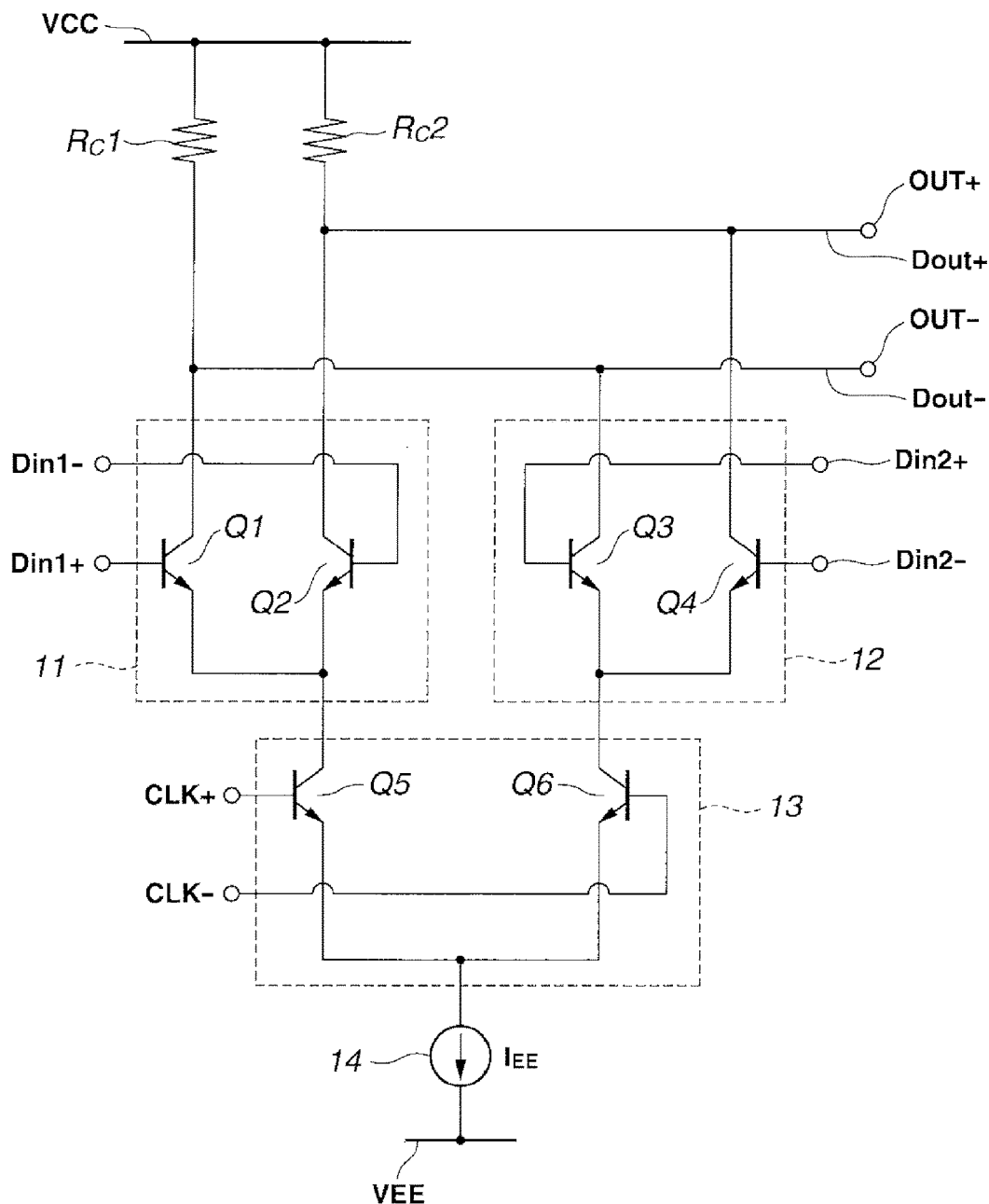
FIG. 23 is a circuit diagram showing a multiplexer core circuit that handles digital signals.

The effect of switching noise reduction will be exemplified next by an operation (simulation) in which the sine wave of 1 GHz and the DC input are rapidly and alternately extracted by a clock of 5 GHz by the analog multiplexer core circuit. FIGS. 18A and 18B show waveforms that have been directly output without placing anything on the stage subsequent to the analog multiplexer core circuit. FIG. 18B is a chart in which the time axis of FIG. 18A has been extended. On the other hand, FIGS. 18C and 18D show waveforms output from an arrangement (an arrangement in which multi-stage differential amplifiers are provided on a stage subsequent to the analog multiplexer core circuit) of the above-described embodiments. FIG. 18D is a chart in which the time axis of FIG. 18C has been extended. As can be confirmed from these waveforms, the switching noise has been reduced by the arrangement of the embodiments, and the waveform quality has been greatly improved.

As described above, by using the analog multiplexer circuit or the analog multiplexer core circuit according to the above-described embodiments, two or more analog signals can be time-multiplexed with low noise, high linearity, and high speed.

INDUSTRIAL APPLICABILITY

The present invention is applicable to an analog multiplexer circuit and an analog multiplexer circuit that includes an analog multiplexer core circuit.

EXPLANATION OF THE REFERENCE NUMERALS AND SIGNS 100, 100A, 100B, 100C, 100D . . . analog multiplexer circuit, 111, 112 . . . linear buffer, 120, 120A, 120B, 120C, 120D . . . analog multiplexer core circuit, 121, 122, 123 . . . differential pair, 130, 130A, 130B, 130C, 130D . . . differential amplifier, 140 . . . buffer, 201, 202 . . . reception/control unit, 203, 204 . . . detection/control circuit, Rc1, Rc2 . . . collector resistor, $R_{EA}1$, $R_{EA}2$, $R_{EA}3$, $R_{EA}4$ . . . emitter resistor, $R_{EC}1$, $R_{EC}2$ . . . emitter resistor, Ain1, Ain1+, Ain1− . . . first analog signal, Ain2, Ain2+, Ain1− . . . second analog signal, Aout, Aout+, Aout− . . . time-multiplexed analog signal, CLK, CLK+, CLK− . . . clock signal, VCC . . . high-potential power supply, VEE . . . low-potential power supply VEE, IN+, IN− . . . input terminal, OUT+, OUT− . . . output terminal

The invention claimed is:
1. An analog multiplexer core circuit comprising:
a first differential pair that includes a first transistor and a second transistor, the first transistor including a collector which is connected to a high-potential power supply via a first collector resistor, a base to which a positive-phase signal of a first analog signal is input, and an emitter, and the second transistor including a collector which is connected to the high-potential power supply via a second collector resistor, a base to which a negative-phase signal of the first analog signal is input, and an emitter;
a second differential pair that includes a third transistor and a fourth transistor, the third transistor including a collector which is connected to the high-potential power supply via the first collector resistor, a base to which a positive-phase signal of a second analog signal is input, and an emitter, and the fourth transistor including a collector connected to the high-potential power supply via the second collector resistor, a base to which a negative-phase signal of the second analog signal is input, and an emitter;
a first output terminal that is connected to the collector of the second transistor and the collector of the fourth transistor;

a second output terminal that is connected to the collector of the first transistor and the collector of the third transistor;

a third differential pair that includes a fifth transistor and a sixth transistor, the fifth transistor including a collector, a base to which a positive-phase signal of a clock signal is input, and an emitter, and the sixth transistor including a collector, a base to which a negative-phase signal of the clock signal is input, and an emitter;

a first current source configured to cause a current of a current value $I_{EE}$ to flow and includes one terminal which is connected to the emitter of the fifth transistor and the emitter of the sixth transistor and the other terminal which is connected to a low-potential power supply;

a first emitter resistor that is connected between the emitter of the first transistor and the collector of the fifth transistor;

a second emitter resistor that is connected between the emitter of the second transistor and the collector of the fifth transistor;

a third emitter resistor that is connected between the emitter of the third transistor and the collector of the sixth transistor;

a fourth emitter resistor that is connected between the emitter of the fourth transistor and the collector of the sixth transistor, wherein a resistance value $R_{EA}$ of each of the first emitter resistor to the fourth emitter resistor satisfies $R_{EA} \cdot I_{EE} \geq$ an amplitude of each of the first analog signal and the second analog signal, a fifth emitter resistor that is connected between the emitter of the fifth transistor and the one terminal of the first current source; and a sixth emitter resistor that is connected between the emitter of the sixth transistor and the one terminal of the first current source, wherein a resistance value $R_{EC}$ of each of the fifth emitter resistor and the sixth emitter resistor satisfies $R_{EC} \cdot I_{EE} <$ an amplitude of the clock signal.

2. The analog multiplexer core circuit according to claim 1, wherein the first current source is a constant current source.

3. The analog multiplexer core circuit according to claim 1, wherein the first current source is a variable current source.

4. An analog multiplexer circuit comprising
an analog multiplexer core circuit including:
a first differential pair that includes a first transistor and a second transistor, the first transistor including a collector which is connected to a high-potential power supply via a first collector resistor, a base to which a positive-phase signal of a first analog signal is input, and an emitter, and the second transistor including a collector which is connected to the high-potential power supply via a second collector resistor, a base to which a negative-phase signal of the first analog signal is input, and an emitter;

a second differential pair that includes a third transistor and a fourth transistor, the third transistor including a collector which is connected to the high-potential power supply via the first collector resistor, a base to which a positive-phase signal of a second analog signal is input, and an emitter, and the fourth transistor including a collector connected to the high-potential power supply via the second collector resistor, a base to which a negative-phase signal of the second analog signal is input, and an emitter;

a first output terminal that is connected to the collector of the second transistor and the collector of the fourth transistor;

a second output terminal that is connected to the collector of the first transistor and the collector of the third transistor;

a third differential pair that includes a fifth transistor and a sixth transistor, the fifth transistor including a collector, a base to which a positive-phase signal of a clock signal is input, and an emitter, and the sixth transistor including a collector, a base to which a negative-phase signal of the clock signal is input, and an emitter;

a first current source configured to cause a current of a current value $I_{EE}$ to flow and includes one terminal which is connected to the emitter of the fifth transistor and the emitter of the sixth transistor and the other terminal which is connected to a low-potential power supply;

a first emitter resistor that is connected between the emitter of the first transistor and the collector of the fifth transistor;

a second emitter resistor that is connected between the emitter of the second transistor and the collector of the fifth transistor;

a third emitter resistor that is connected between the emitter of the third transistor and the collector of the sixth transistor; and a fourth emitter resistor that is connected between the emitter of the fourth transistor and the collector of the sixth transistor, wherein a resistance value $R_{EA}$ of each of the first emitter resistor to the fourth emitter resistor satisfies $R_{EA} \cdot I_{EE} \geq$ an amplitude of each of the first analog signal and the second analog signal, and a differential amplifier that is connected to the first output terminal and the second output terminal of the analog multiplexer core circuit and configured to differentially amplify a positive-phase signal of a time-multiplexed analog signal output from the first output terminal and a negative-phase signal of the time-multiplexed analog signal output from the second terminal, wherein the differential amplifier comprises
a fourth differential pair that includes a seventh transistor and an eighth transistor, the seventh transistor including a collector connected to the high-potential power supply via a third collector resistor, a base to which the positive-phase signal of the time-multiplexed analog signal is input, and an emitter, and the eighth transistor including a collector connected to the high-potential power supply via a fourth collector resistor, a base to which the negative-phase signal of the time-multiplexed analog signal is input, and an emitter, a third output terminal that is connected to the collector of the eighth transistor, a fourth output terminal that is connected to the collector of the seventh transistor, a second current source configured to cause a current of a current value $I_{EE1}$ to flow and includes one terminal and the other terminal which is connected to the low-potential power supply, a seventh emitter resistor that is connected between the emitter of the seventh transistor and the one terminal of the second current source, and an eighth emitter resistor that is connected between the emitter of the eighth transistor and the one terminal of the second current source, wherein a resistance value $R_E$ of each of the seventh emitter resistor and the eight emitter resistor satisfies $R_E \cdot I_{EE1} \geq$ an amplitude of the time-multiplexed analog signal.

5. An analog multiplexer circuit comprising
an analog multiplexer core circuit including:
   a first differential pair that includes a first transistor and a second transistor, the first transistor including a collector which is connected to a high-potential power supply via a first collector resistor, a base to which a positive-phase signal of a first analog signal is input, and an emitter, and the second transistor including a collector which is connected to the high-potential power supply via a second collector resistor, a base to which a negative-phase signal of the first analog signal is input, and an emitter;
   a second differential pair that includes a third transistor and a fourth transistor, the third transistor including a collector which is connected to the high-potential power supply via the first collector resistor, a base to which a positive-phase signal of a second analog signal is input, and an emitter, and the fourth transistor including a collector connected to the high-potential power supply via the second collector resistor, a base to which a negative-phase signal of the second analog signal is input, and an emitter;
   a first output terminal that is connected to the collector of the second transistor and the collector of the fourth transistor;
   a second output terminal that is connected to the collector of the first transistor and the collector of the third transistor;
   a third differential pair that includes a fifth transistor and a sixth transistor, the fifth transistor including a collector, a base to which a positive-phase signal of a clock signal is input, and an emitter, and the sixth transistor including a collector, a base to which a negative-phase signal of the clock signal is input, and an emitter;
   a first current source configured to cause a current of a current value $I_{EE}$ to flow and includes one terminal which is connected to the emitter of the fifth transistor and the emitter of the sixth transistor and the other terminal which is connected to a low-potential power supply, wherein the first current source is a variable current source;
   a first emitter resistor that is connected between the emitter of the first transistor and the collector of the fifth transistor;
   a second emitter resistor that is connected between the emitter of the second transistor and the collector of the fifth transistor;
   a third emitter resistor that is connected between the emitter of the third transistor and the collector of the sixth transistor, and
   a fourth emitter resistor that is connected between the emitter of the fourth transistor and the collector of the sixth transistor,
   wherein a resistance value $R_{EA}$ of each of the first emitter resistor to the fourth emitter resistor satisfies $R_{EA} \cdot I_{EE} \geq$ an amplitude of each of the first analog signal and the second analog signal,
a differential amplifier that is connected to the first output terminal and the second output terminal of the analog multiplexer core circuit and configured to differentially output a positive-phase signal of a time-multiplexed analog signal output from the first output terminal and a negative-phase signal of the time-multiplexed analog signal output from the second output terminal; and
   a control circuit that causes the variable current source to cause a current satisfying $R_{EA} \cdot I_{EE} \geq$ an amplitude of each of the first analog signal and the second analog signal to flow in accordance with amplitudes of the first analog signal and the second analog signal.

6. The analog multiplexer circuit according to claim 5, further comprising:
   a reception circuit configured to receive amplification information indicating an amplitude value of each of the first analog signal and the second analog signal and output the amplitude information to the control circuit.

7. The analog multiplexer circuit according to claim 5, further comprising:
   a detection circuit configured to detect an amplitude value of each of the first analog signal and the second analog signal and output amplitude information indicating the amplitude value to the control circuit.

8. The analog multiplexer circuit according to claim 5, wherein the differential amplifier comprises
   a fourth differential pair that includes a seventh transistor and an eighth transistor, the seventh transistor including a collector connected to the high-potential power supply via a third collector resistor, a base to which the positive-phase signal of the time-multiplexed analog signal is input, and an emitter, and the eighth transistor including a collector connected to the high-potential power supply via a fourth collector resistor, a base to which the negative-phase signal of the time-multiplexed analog signal is input, and an emitter,
   a third output terminal that is connected to the collector of the eighth transistor,
   a fourth output terminal that is connected to the collector of the seventh transistor,
   a second current source configured to cause a current of a current value $I_{EE1}$ to flow and includes one terminal and the other terminal which is connected to the low-potential power supply,
   a seventh emitter resistor that is connected between the emitter of the seventh transistor and the one terminal of the second current source, and
   an eighth emitter resistor that is connected between the emitter of the eighth transistor and the one terminal of the second current source,
   wherein the second current source is a variable current source, and
   the control circuit causes, in accordance with the amplitudes of the first analog signal and the second analog signal, the second current source to cause a current to flow so that a resistance value $R_E$ of each of the seventh emitter resistor and the eight emitter resistor satisfies $R_E \cdot I_{EE1} \geq$ an amplitude of the time-multiplexed analog signal.

9. The analog multiplexer circuit according to claim 4, further comprising:
   a ninth transistor that is cascode-connected to the seventh transistor; and
   a tenth transistor that is cascode-connected to the eighth transistor.

10. The analog multiplexer circuit according to claim 4, wherein the differential amplifier further comprises a level shifter configured to shift DC-voltage levels of the positive-phase signal of the time-multiplexed analog signal and the negative-phase signal of the time-multiplexed analog signal.

11. The analog multiplexer circuit according to claim 10, wherein the level shifter comprises
an eleventh transistor that includes a collector connected to the high-potential power supply, a base to which the positive-phase signal of the time-multiplexed analog signal is input, and an emitter,
a first constant current source that includes one terminal which is connected to the emitter of the eleventh transistor and the other terminal which is connected to the low-potential power supply,
a twelfth transistor that includes a collector connected to the high-potential power supply, a base to which the negative-phase signal of the time-multiplexed analog signal is input, and an emitter, and
a second constant current source that includes one terminal which is connected to the emitter of the twelfth transistor and the other terminal which is connected to the low-potential power supply.

12. The analog multiplexer circuit according to claim 11, wherein the level shifter further comprises
a first diode that is connected to the emitter of the eleventh transistor and the one terminal of the first constant current source, and
a second diode that is connected to the emitter of the twelfth transistor and the one terminal of the second constant current source.

13. An analog multiplexer circuit comprising
a first analog multiplexer core circuit, a second multiplexer core circuit and a third multiplexer core circuit, each of which includes:
a first differential pair that includes a first transistor and a second transistor, the first transistor including a collector which is connected to a high-potential power supply via a first collector resistor, a base to which a positive-phase signal of a first analog signal is input, and an emitter, and the second transistor including a collector which is connected to the high-potential power supply via a second collector resistor, a base to which a negative-phase signal of the first analog signal is input, and an emitter;
a second differential pair that includes a third transistor and a fourth transistor, the third transistor including a collector which is connected to the high-potential power supply via the first collector resistor, a base to which a positive-phase signal of a second analog signal is input, and an emitter, and the fourth transistor including a collector connected to the high-potential power supply via the second collector resistor, a base to which a negative-phase signal of the second analog signal is input, and an emitter;
a first output terminal that is connected to the collector of the second transistor and the collector of the fourth transistor;
a second output terminal that is connected to the collector of the first transistor and the collector of the third transistor;
a third differential pair that includes a fifth transistor and a sixth transistor, the fifth transistor including a collector, a base to which a positive-phase signal of a clock signal is input, and an emitter, and the sixth transistor including a collector, a base to which a negative-phase signal of the clock signal is input, and an emitter;
a first current source configured to cause a current of a current value $I_{EE}$ to flow and includes one terminal which is connected to the emitter of the fifth transistor and the emitter of the sixth transistor and the other terminal which is connected to a low-potential power supply;
a first emitter resistor that is connected between the emitter of the first transistor and the collector of the fifth transistor;
a second emitter resistor that is connected between the emitter of the second transistor and the collector of the fifth transistor;
a third emitter resistor that is connected between the emitter of the third transistor and the collector of the sixth transistor; and
a fourth emitter resistor that is connected between the emitter of the fourth transistor and the collector of the sixth transistor,
wherein a resistance value $R_{EA}$ of each of the first emitter resistor to the fourth emitter resistor satisfies
$R_{EA} \cdot I_{EE} \geq$ an amplitude of each of the first analog signal and the second analog signal;
wherein two analog signals as the first analog signal and the second analog signal are input to the first analog multiplexer core circuit, and a first clock signal as the clock signal is input to the first analog multiplexer core circuit,
wherein two analog signals different from the two analog signals are input to the second analog multiplexer core circuit as the first analog signal and the second analog signal, and the first clock signal as the clock signal is input to the second analog multiplexer core circuit in a different phase from that of the first analog multiplexer core circuit, and
wherein two time-multiplexed analog signals output from the first analog multiplexer core circuit and the second analog multiplexer core circuit are input to the third analog multiplexer core circuit as the first analog signal and the second analog signal, and a second clock signal whose cycle is ½ that of the cycle of the first clock signal is input to the third analog multiplexer core circuit as the clock signal.

14. The analog multiplexer circuit according to claim 8, further comprising:
a ninth transistor that is cascode-connected to the seventh transistor; and
a tenth transistor that is cascode-connected to the eighth transistor.

15. The analog multiplexer circuit according to claim 8, wherein the differential amplifier further comprises a level shifter configured to shift DC-voltage levels of the positive-phase signal of the time-multiplexed analog signal and the negative-phase signal of the time-multiplexed analog signal.

16. The analog multiplexer circuit according to claim 15, wherein the level shifter comprises
an eleventh transistor that includes a collector connected to the high-potential power supply, a base to which the positive-phase signal of the time-multiplexed analog signal is input, and an emitter,
a first constant current source that includes one terminal which is connected to the emitter of the eleventh transistor and the other terminal which is connected to the low-potential power supply,
a twelfth transistor that includes a collector connected to the high-potential power supply, a base to which the negative-phase signal of the time-multiplexed analog signal is input, and an emitter, and
a second constant current source that includes one terminal which is connected to the emitter of the twelfth transistor and the other terminal which is connected to the low-potential power supply.

17. The analog multiplexer circuit according to claim 16, wherein the level shifter further comprises
   a first diode that is connected to the emitter of the eleventh transistor and the one terminal of the first constant current source, and
   a second diode that is connected to the emitter of the twelfth transistor and the one terminal of the second constant current source.

18. The analog multiplexer core circuit according to claim 4, wherein the first current source is a constant current source.

19. The analog multiplexer core circuit according to claim 4, wherein the first current source is a variable current source.

* * * * *